(12) United States Patent
Fratin et al.

(10) Patent No.: US 11,825,754 B2
(45) Date of Patent: *Nov. 21, 2023

(54) MEMORY CELLS WITH SIDEWALL AND BULK REGIONS IN PLANAR STRUCTURES

(71) Applicant: Micron Technology, Inc., Boise, ID (US)

(72) Inventors: Lorenzo Fratin, Buccinasco (IT); Enrico Varesi, Milan (IT); Paolo Fantini, Vimercate (IT)

(73) Assignee: Micron Technology, Inc., Boise, ID (US)

( * ) Notice: Subject to any disclaimer, the term of this patent is extended or adjusted under 35 U.S.C. 154(b) by 24 days.

This patent is subject to a terminal disclaimer.

(21) Appl. No.: 17/332,691

(22) Filed: May 27, 2021

(65) Prior Publication Data

US 2022/0384720 A1  Dec. 1, 2022

(51) Int. Cl.
*H10N 70/20* (2023.01)
*G11C 11/56* (2006.01)
*G11C 13/00* (2006.01)
*H10B 63/00* (2023.01)
*H10N 70/00* (2023.01)

(52) U.S. Cl.
CPC ....... *H10N 70/231* (2023.02); *G11C 11/5678* (2013.01); *G11C 13/0004* (2013.01);
(Continued)

(58) Field of Classification Search
CPC ... H01L 45/06; H01L 27/2481; H01L 45/141; H01L 45/1641; H01L 45/1675;
(Continued)

(56) References Cited

U.S. PATENT DOCUMENTS 10,256,466 B2  4/2019  Collins et al.
10,490,602 B2  11/2019  Pellizzer et al.
(Continued)

FOREIGN PATENT DOCUMENTS

TW  200829509 A  7/2008

OTHER PUBLICATIONS

"International Search Report and Written Opinion of the International Searching Authority," issued in connection with Int'l Appl. No. PCT/US2022/072387 dated Sep. 15, 2022 (10 pages).
(Continued)

*Primary Examiner* — Jerome Leboeuf
(74) *Attorney, Agent, or Firm* — Holland & Hart LLP

(57) ABSTRACT

A memory cell may include a first electrode, a second electrode, and a self-selecting storage element between the first electrode and the second electrode. A conductive path between the first electrode and the second electrode may extend in a direction away from a plane defined by a substrate. The self-selecting storage element may include a bulk region and a sidewall region. The bulk region may include a chalcogenide material having a first composition, and the sidewall region may include the chalcogenide material having a second composition that is different than the first composition. The bulk region and sidewall region may extend between the first electrode and the second electrode and in the direction away from the plane defined by the substrate.

17 Claims, 14 Drawing Sheets

(52) U.S. Cl.
CPC ......... *G11C 13/0069* (2013.01); *H10B 63/84* (2023.02); *H10N 70/041* (2023.02); *H10N 70/063* (2023.02); *H10N 70/882* (2023.02)

(58) Field of Classification Search
CPC ............ G11C 11/5678; G11C 13/0004; G11C 13/0069; G11C 13/003; G11C 2213/73; H10N 70/231; H10N 70/041; H10N 70/063; H10N 70/882; H10N 70/066; H10N 70/20; H10N 70/823; H10N 70/826; H10N 70/8825; H10B 63/84; H10B 63/845

See application file for complete search history.

(56) References Cited

U.S. PATENT DOCUMENTS

| | | |
|---|---|---|
| 10,593,399 B2 | 3/2020 | Fratin et al. |
| 10,700,128 B1 | 6/2020 | Fantini et al. |
| 2005/0110983 A1 | 5/2005 | Jeong et al. |
| 2006/0110888 A1 | 5/2006 | Cho et al. |
| 2012/0142161 A1 | 6/2012 | Ha et al. |
| 2016/0064453 A1 | 3/2016 | Hou et al. |
| 2017/0316822 A1* | 11/2017 | Sei ...................... H01L 45/1233 |
| 2018/0315475 A1* | 11/2018 | Redaelli ............... H01L 45/144 |
| 2019/0036022 A1 | 1/2019 | Pirovano et al. |
| 2019/0088873 A1 | 3/2019 | Fantini et al. |
| 2020/0118621 A1* | 4/2020 | Redaelli ............... G11C 13/004 |
| 2020/0350203 A1 | 11/2020 | Fratin et al. |
| 2021/0005665 A1 | 1/2021 | Fantini et al. |
| 2021/0083184 A1* | 3/2021 | Kobayashi ............... G11C 8/14 |

OTHER PUBLICATIONS

Taiwan Patent Office, "Office Action," issued in connection with Taiwan Patent Application No. 111119270 dated Jun. 7, 2023 (23 pages) (10 pages of English Translation and 13 pages of Original Document).

* cited by examiner

MEMORY CELLS WITH SIDEWALL AND BULK REGIONS IN PLANAR STRUCTURES

FIELD OF TECHNOLOGY

The following relates generally to one or more systems for memory and more specifically to memory cells with sidewall and bulk regions in planar structures.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

Figure 1:
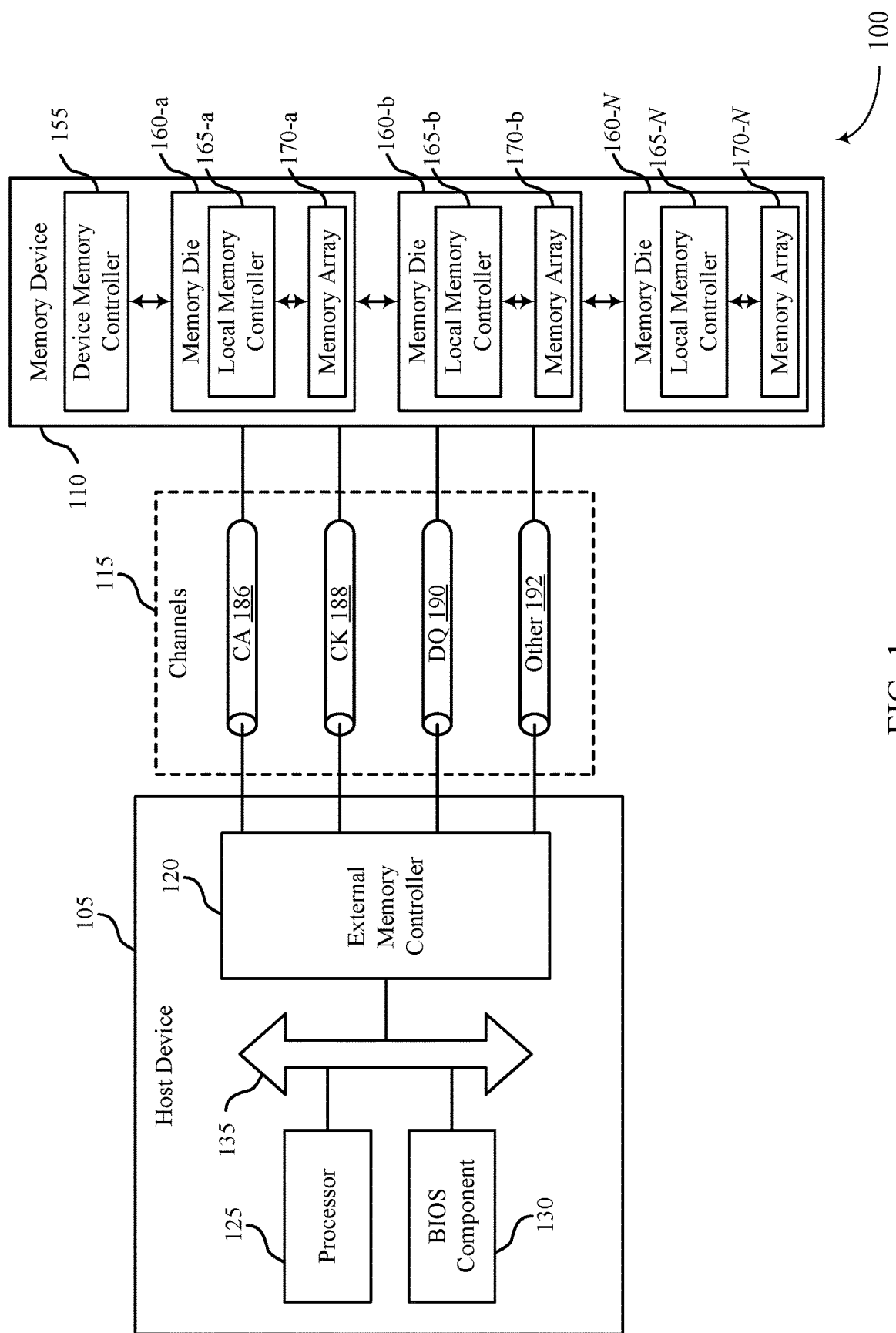
FIG. 1 illustrates an example of a system that includes memory cells with sidewall and bulk regions in accordance with examples as disclosed herein.

A memory device may include self-selecting memory cells formed of a chalcogenide material. The self-selecting memory cell may be an example of a resistive memory that is configured to store information based on a programmable resistance or a programmable threshold voltage of the chalcogenide material. The information stored by the self-selecting memory cell may be based on a polarity of signal used to write the information to the self-selecting memory cell and a polarity of the signal used to read the information from the self-selecting memory cell. The chalcogenide material of the self-selecting memory cell may include different regions having different concentrations of materials to perform different functions. For example, the memory cell may include a "bulk region" configured to store the information and a "sidewall region" configured to protect the bulk region.

A first layer of a planar memory array may include a set of memory cells that extend in a direction that is normal to a substrate and that are distributed across the substrate. In some examples, the set of memory cells may be referred to as vertically-disposed memory cells and may be self-selecting memory cells having programmable threshold voltages. Self-selecting memory cells may not be coupled with a selection element (e.g., a transistor or diode) for isolating the storage element from voltages applied across other self-selecting memory cells in the memory array. The set of vertically-disposed, self-selecting memory cells may include a vertical stack of components, including a bottom electrode composed of a conductive material, a storage element on top of the bottom electrode, composed of a chalcogenide material, and having a programmable threshold voltage, and a top electrode on top of the storage element and composed of the conductive material.

A voltage (or sequence of voltages) may be applied to a storage element to program the threshold voltage of the storage element to a desired level. The application of the voltages to the storage element may stress (mechanically, thermally, electrically, etc.) the storage element. Over time, the application of the voltages may reduce a structural integrity of the storage element. Also, the reduction in the structural integrity of the storage element may reduce a structural integrity of the self-selecting memory cell—e.g., when the storage element is composed entirely of the chalcogenide material. Additionally, in some examples, a performance of a storage element may be decreased when the dimensions of the storage element have the same (or nearly the same) dimensions as the other elements in a vertically-disposed memory cell.

The memory cell may include a storage element having a non-programmable sidewall region and a programmable bulk region. In some examples, the sidewall region may be formed based on being exposed to processes used to form the vertically-disposed memory cell. The sidewall region may extend from a bottom electrode of the vertically-disposed memory cell to a top electrode of the vertically-disposed memory cell in a vertical direction that is parallel to a conductive path through the vertically-disposed memory cell. The sidewall region may protect the bulk region and may mechanically stabilize the vertically-disposed memory cell against stresses that may occur during programming operations or during manufacturing. However, in some examples, the sidewall region of the storage element may decrease a power efficiency of the memory array—e.g. based on excessive leakage current through the sidewall region. Additionally, or alternatively, the dimensions of the sidewall region may cause the bulk region to have undesirable dimensions.

To improve a performance of vertically-disposed, procedures for forming a planar memory array may be modified to obtain a sidewall region and bulk region of a storage element that increase a structurally integrity of the memory cell, improve a performance of the storage element, or both without increasing (or with minimal increase to) power consumption for the memory array. In some examples, the procedures for forming the planar memory array may be configured to increase a width of a sidewall region of a storage element (e.g., to mechanically strengthen the storage element). In some examples, the procedures for forming the planar memory array may be configured to increase a resistivity of the sidewall region (e.g., to decrease leakage through the storage element). In some examples, the procedure for forming the planar memory array may be configured to obtain a width of the sidewall region that results in a width of the bulk region that is within a threshold range (e.g., to improve a performance of the bulk region). In some examples, the procedures for forming the planar memory array are configured to obtain a combination of strength, leakage, and performance characteristics for a storage element.

Features of the disclosure introduced above are further described below in the context of a memory system. Specific examples are then described of storage elements in planar structures, methods for forming storage elements in planar structures, storage elements in vertical structures, and methods for forming storage element in vertical structures, the storage elements having sidewall and bulk regions. These and other features of the disclosure are further illustrated by and described with reference to apparatus diagrams, system diagrams, and flowcharts that relate to memory cells with sidewall and bulk regions in planar structures.

FIG. 1 illustrates an example of a system that includes memory cells with sidewall and bulk regions in accordance with examples as disclosed herein. System 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general-purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, a memory die 160 may include vertically-disposed, self-selecting memory cells; horizontally-disposed, self-selecting memory cells; or both. The self-selecting memory cells may include storage components having sidewall regions and bulk regions. A bulk region and a sidewall region may be composed of a chalcogenide material, but the bulk region may have a different composition than a sidewall region. In some examples, the composition of the chalcogenide material that composes the bulk region is programmable while the composition of the chalcogenide material that composes the sidewall region is not. Despite not being programmable, the sidewall region may increase a structural integrity of the self-selecting memory cell, among other benefits. In some examples, the sidewall regions may be formed to increase a structural integrity of the memory cells (and, in some examples, memory die 160), to control the dimensions of the bulk region (e.g., to improve a performance of the bulk region), to increase a resistivity of the sidewall region (e.g., to decrease leakage through the sidewall region), or any combination thereof.

Figure 2:
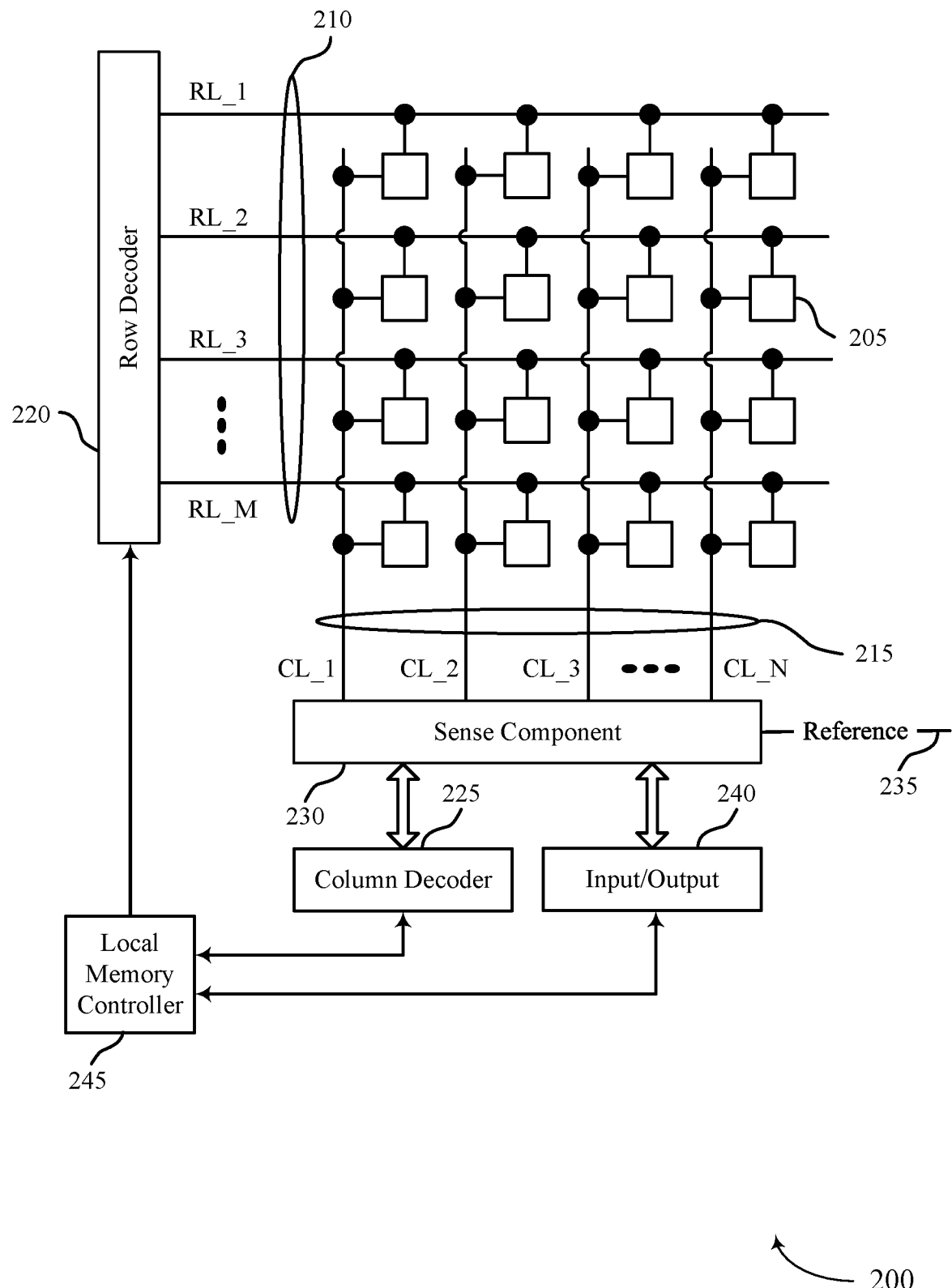
FIG. 2 illustrates an example of a memory die that includes memory cells with sidewall and bulk regions in accordance with examples as disclosed herein.

FIG. 2 illustrates an example of a memory die that includes memory cells with sidewall and bulk regions in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, a memory die 200 may include vertically-disposed, self-selecting memory cells (e.g., memory cell 205); horizontally-disposed, self-selecting memory cells (e.g., memory cell 205); or both. The self-selecting memory cells (e.g., memory cell 205) may include storage components having sidewall regions and bulk regions. A bulk region and a sidewall region may be composed of a chalcogenide material, but the bulk region may have a different composition than a sidewall region. In some examples, the composition of the chalcogenide material that composes the bulk region is programmable while the composition of the chalcogenide material that composes the sidewall region is not. Despite not being programmable, the sidewall region may increase a structural integrity of the self-selecting memory cell, among other benefits. In some examples, the sidewall regions may be formed to increase a structural integrity of the memory cells 205 (and, in some examples, memory die 200), to control the dimensions of the bulk region (e.g., to improve a performance of the bulk region), to increase a resistivity of the sidewall region (e.g., to decrease leakage through the sidewall region), or any combination thereof.

Figure 3:
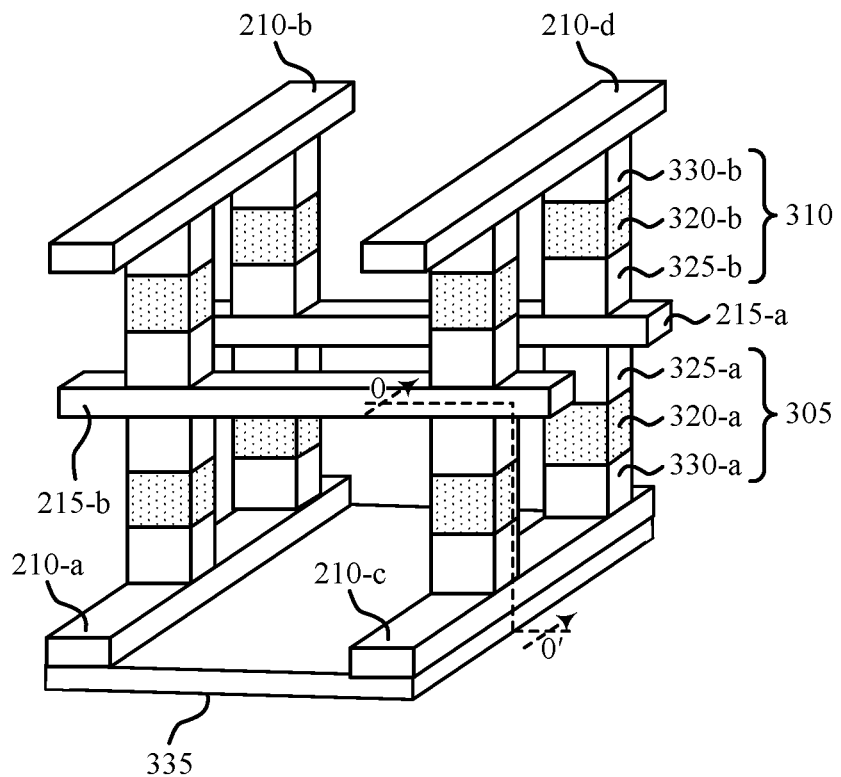
FIG. 3 illustrates an example of a planar memory array having vertically-disposed memory cells in accordance with examples as disclosed herein.

FIG. 3 illustrates an example of a planar memory array having vertically-disposed memory cells in accordance with examples as disclosed herein. Memory array 300 may be an example of portions of the memory arrays or memory dies described with reference to FIGS. 1 and 2. The memory array 300 may include a first deck 305 of memory cells that is positioned above a substrate 335 and a second deck 310 of memory cells on top of the first array or first deck 305. Though the example of memory array 300 includes two decks (e.g., first deck 305 and second deck 310), the memory array 300 may include any quantity of decks (e.g., one deck or more than two decks).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. In some examples, a row line 210 may also be referred to as a word line and a column line 215 may be referred to as a bit line or digit line. One or more memory cells of the first deck 305 and the second deck 310 may include one or more chalcogenide materials in a pillar between access lines. For example, a single stack between access lines may include a first electrode, a first chalcogenide material (e.g., selector component), a second electrode, a second chalcogenide material (e.g., storage element), a third electrode, or any combination thereof. Although some elements included in FIG. 3 are labeled with a numeric indicator, other corresponding elements are not labeled, although they are the same or similar, in an effort to increase visibility and clarity of the depicted features.

One or more memory cells of the first deck 305 may include a first electrode 325-a, a storage element 320-a, or a second electrode 330-a. One or more memory cells of the second deck 310 may include a first electrode 325-b, a storage element 320-b, and a second electrode 330-b. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of first deck 305 and second deck 310 may share column lines 215 or row lines 210. For example, the first electrode 325-b of the second deck 310 and the second electrode 330-b of the first deck 305 may be coupled with column line 215-a such that the column line 215-a may be shared by vertically adjacent memory cells. In some examples, the electrode contacting a column line 215 may be referred to as a top electrode (e.g., a first electrode 325) and the electrode contacting a row line 210 may be referred to as a bottom electrode (e.g., a second electrode 330).

In some examples, the material of the storage element 320 may include a chalcogenide material or other alloy including selenium (Se), tellurium (Te), arsenic (As), antimony (Sb), carbon (C), germanium (Ge), silicon (Si), or indium (In), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as a SiSAG-alloy. In some examples, a SAG-alloy may include silicon (Si) or indium (In), or a combination thereof, and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., first electrode 325-a, storage element 320-a, second electrode 330-a), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state.

To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states. In some examples, such as for thresholding memory cells or self-selecting memory cells, some or all of the set of logic states supported by the memory cells may be associated with an amorphous state of the chalcogenide material (e.g., the material in a single state may be operable to store different logic states).

The architecture of memory array 300 may be referred to as a cross-point architecture, where a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above the substrate 335, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or an electrode may be electrically in series between a row line 210 and a column line 215 but may not be in a pillar or stack.

The architecture of memory array 300 may also be referred to as a planar architecture, and memory array 300 may be referred to as a planar memory array. A planar memory array may be formed by depositing, on a substrate, different materials on top of one another to obtain a stack of material layers. After forming the stack of material layers, material may be removed from the stack of material layers to form pillars including memory cells that are vertically-disposed relative to the substrate 335 (also referenceable as vertically-disposed memory cells). In some examples, conductive contacts are embedded within the substrate 335 and are used to access an access line (e.g., a row line 210). In some examples, a first material layer (e.g., a conductive material layer) may be formed on top of the substrate 335. A second material layer (e.g., another conductive material layer) may be formed on top of the first material layer. A third material layer (e.g., a chalcogenide material layer) may be formed on top of the second material layer. A fourth material layer (e.g., another conductive material layer) may be formed on top of the third material layer. And a fifth material layer (e.g., yet another conductive material layer) may be formed on top of the fifth material layer.

While (or after) the stack of material layers is formed, portions of the material layers may be removed (e.g., using an etching process) to form vertical pillars that extend between word lines and bit lines and include vertically-disposed memory cells that are composed of the different material layers and separated from one another (e.g., by empty space). In some examples, the first material layer is used to form row lines 210; the second material layer is used to form second electrodes 330 of the vertically-disposed memory cells that are in contact with respective word lines; the third material layer is used to form storage elements 320 of the vertically-disposed memory cells; the fourth material layer is used to form first electrodes 325 of the vertically-disposed memory cells; and the fifth material layer is used to form column lines 215 that are in contact with respective first electrodes 325.

In some examples, after forming the vertically-disposed memory cells (or while the vertically-disposed memory cells are formed), a space between the vertically-disposed memory cells may be filled in with a filling material (e.g., with an insulative material, dielectric material, etc.). Thus, a process used to form a planar memory array may result in vertically-disposed memory cells that are separated (isolated) from one another by an insulative material (e.g., a dielectric material). In some examples, the processes for removing and forming portions of the material layers may include operations for cleaning, sealing, temperature-treating, doping (e.g., with contaminants) exposed portions of the material layer, or any combination thereof.

As described herein, a vertically-disposed memory cell may include a second electrode 330, a storage element 320, and a first electrode 325. In some examples, a vertically-disposed memory cell may be an example of a self-selecting memory cell. In such examples, the material used in the storage element 320 may be based on an alloy (such as the alloys listed above). The storage element 320 may be operated so as to undergo a change to a different physical state during normal operation of the memory cell. For example, a self-selecting memory cell may be programmed to have a high threshold voltage state or a low threshold voltage state. A high threshold voltage state may correspond to a first logic state (e.g., a RESET state) and a low threshold voltage state may correspond to a second logic state (e.g., a SET state). The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

As a result of having a programmable threshold voltage, current may flow through a storage element 320 when a voltage applied across the storage element 320 exceeds a programmed threshold voltage. Thus, an operation for accessing one self-selecting memory cell may not disturb a state of another self-selecting memory cell (e.g., that has a higher threshold voltage) that is coupled with a common access line. Accordingly, self-selecting memory cells may not be coupled with a selection element (e.g., a transistor or diode) for isolating the self-selecting memory cell from voltages applied to electrically-coupled memory cells.

A voltage (or sequence of voltages) may be applied to a storage element to program the threshold voltage of the storage element to a desired level. The application of the voltages to the storage element may stress (mechanically, thermally, electrically, etc.) the storage element. Over time, the application of the voltages may reduce a structural integrity of the storage element. Also, the reduction in the structural integrity of the storage element may reduce a structural integrity of the self-selecting memory cell—e.g., when the storage element is composed entirely of the chalcogenide material. Additionally, in some examples, a performance of a storage element may be decreased when the dimensions of the storage element have the same (or nearly the same) dimensions as the other elements in a vertically-disposed memory cell.

In some examples, aspects of a memory cell (e.g., the sides or exterior of a portion of the storage element) may be exposed to the formation and removal processes that occur after a portion of the memory cell is formed—e.g., the cleaning, sealing, or temperature-treating processes. In some examples, a composition of aspects of a storage element that are exposed to the additional formation and removal processes may be changed relative to aspects of the storage element (which may be referred to as bulk region) that are not (or are less) exposed to the additional formation and removal processes (e.g., interior portions of the storage element). That is, a portion of a chalcogenide material that forms the storage element and is exposed to the additional processes may be contaminated, a concentration of components of the alloy may be changed, or both.

In some examples, the modified portions of the storage element may be referred to as a sidewall region of the storage element, and the unmodified portions of the storage element may be referred to as a bulk region of the storage element. In some examples, the sidewall region of the storage elements may have a different (e.g., a reduced) conductivity than the bulk region of the storage elements. Additionally, the sidewall region of the storage element may not be programmable—that is, the sidewall region of the storage element may not change their state when voltages are applied across the memory cell. Accordingly, the sidewall region of the storage element may not be subjected to the same stress as the bulk region of the storage element and may be structurally stronger than the bulk region of the storage element—e.g., over time.

In some examples, a sidewall region of a storage element may extend, in a vertical direction that is parallel to a conductive path through a vertically-disposed memory cell, from an electrode of the vertically-disposed memory (which may be referred to as a bottom electrode) that contacts a word line to another electrode of the vertically-disposed memory (which may be referred to as a top electrode) that contacts a bit line. Also, in some examples, the sidewall region may encircle (or partially encircle) the storage element of the vertically-disposed memory cell. Thus, the sidewall region of the storage element may protect the bulk region of the storage element and may mechanically stabilize a vertically-disposed memory cell against stresses that may occur during programming operations. However, in some examples, the sidewall regions of the storage element may introduce excessive leakage current, decreasing a power efficiency of a memory array. In some examples, the leakage current through the sidewall regions may be proportional to a width of the sidewall regions, and may increase or decrease based on the concentration of different elements in the sidewall regions. Additionally, or alternatively, the dimensions of the sidewall region may cause the bulk region of the storage element to have undesirable dimensions.

To improve a performance of vertically-disposed, self-selecting memory cells, procedures for forming a planar memory array may be modified to obtain a sidewall region and bulk region of a storage element that increase a structurally integrity of the memory cell, improve a performance of the storage element, or both without increasing (or with minimal increase to) power consumption for the memory array. In some examples, the procedures for forming the planar memory array may be configured to increase a width of a sidewall region of a storage element (e.g., to mechanically strengthen the storage element). In some examples, the procedures for forming the planar memory array may be configured to increase a resistivity of the sidewall region (e.g., to decrease leakage through the storage element). In some examples, the procedure for forming the planar memory array may be configured to obtain a width of the sidewall region that results in a width of the bulk region that is within a threshold range (e.g., to improve a performance of the bulk region). In some examples, the procedures for forming the planar memory array are configured to obtain a combination of strength, leakage, and performance characteristics for a storage element.

Figure 4:
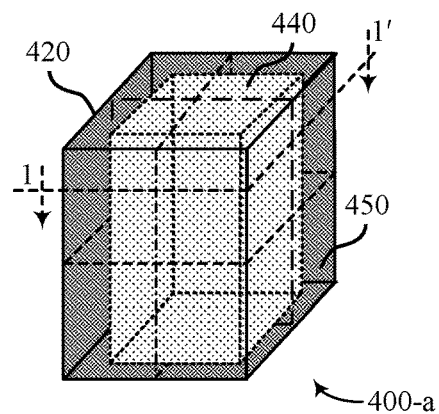
FIG. 4 illustrates multiple views of a storage element having a sidewall and bulk region in accordance with examples as disclosed herein.
Figure 4:
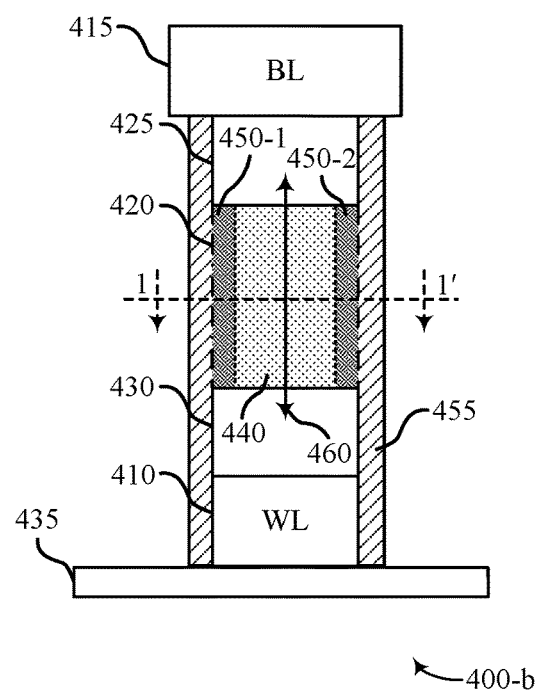
Figure 4:
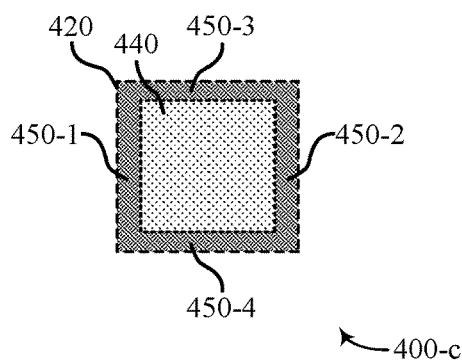

FIG. 4 illustrates multiple views of a storage element having a sidewall and bulk region in accordance with examples as disclosed herein. First perspective 400-*a* shows a three-dimensional view of storage element 420. Storage element 420 may be an example of a storage element 320 as described with reference to FIG. 3 (e.g., the storage element associated with cross-section line 0).

Storage element 420 may include bulk region 440 and sidewall region 450 (indicated by the darker shading). As described herein, both bulk region 440 and sidewall region 450 may include a chalcogenide material, where a composition of the chalcogenide material in bulk region 440 may be different than a composition of the chalcogenide material in sidewall region 450. For example, the percentages of the component elements of the bulk region 440 may be different than the percentages of the component elements of the sidewall region 450. In some examples, the chalcogenide material in bulk region 440 may be programmable to have different threshold voltages, while the chalcogenide material in sidewall region 450 may not be programmable. In some examples, the chalcogenide material in sidewall region 450 may be more structurally reliable (e.g., over an operating life of storage element 420) than the chalcogenide material in bulk region 440. The chalcogenide material in sidewall region 450 may also have a high resistivity to prevent electrical leakage through sidewall region 450 when a voltage is applied across storage element 420.

Second perspective 400-*b* shows a cross-sectional view of memory array 300 along line 0-0' shown in FIG. 3A. The cross-sectional view of second perspective 400-*b* may include aspects of a vertical pillar that includes storage element 420 and may be obtained by looking from a front or back of memory array 300 after obtaining the cross-section shown in second perspective 400-*b*. The vertical pillar may include bit line 415, top electrode 425, bottom electrode 430, and word line 410, which may be examples of a column line 215, first electrode 325, second electrode 330, and row line 210 described in FIGS. 2 and 3.

In some examples, sidewall region 450 may be broken into first sidewall region 450-1 and second sidewall region 450-2. In some examples, seal 455 may be applied around the vertical pillar—e.g., to protect the materials in the vertical pillar from a dielectric filling material. In some examples, the vertical pillar may extend (and the components of the vertical pillar may be stacked) in a direction that is normal to a plane defined by substrate 435. As depicted by current path 460, current may flow through storage element 420 in the direction that is normal to the plane defined by substrate 435. In some examples, word line 410 is in contact with one or more conductive contacts embedded in substrate 435.

Third perspective 400-*c* shows a cross-sectional view of storage element 420 along the line 1-1' shown in second perspective 400-*b*. The cross-sectional view of third perspective 400-*c* may be obtained by looking in the direction of current path 460 through storage element 420 (e.g., looking from a bottom or top side of storage element 420). In some cases, the sidewall region 450 may surround the bulk region 440. In such examples, the sidewall region may be broken into a third sidewall region 450-3 and a fourth sidewall region 450-4, that both contact the first sidewall region 450-1 and the second sidewall region 450-2. In some cases, the sidewall region 450 may include two discontinuous regions, such as the first sidewall region 450-1 and the second sidewall region 450-2 without including the third sidewall region 450-3 or the fourth sidewall region 450-4. In some examples, sidewall region 450 may include one region (e.g., one of first sidewall region 450-1, second sidewall region 450-2, third sidewall region 450-3, or fourth sidewall region 450-4).

In some examples, a process associated with forming storage element 420 may be configured to obtain a desired sidewall region and bulk region configuration. In some examples, the formation process is configured to obtain a sidewall region of a desired composition, desired resistivity, desired dimensions, or any combination thereof. For example, the formation process may be configured to form a sidewall region, where no side of sidewall region 450 has a width that is less than 5% of the width of storage element 420 (thus, a combined width of two sides of sidewall region 250 may be at least 10% of the width of storage element 420). In some examples, the formation process is configured to obtain a bulk region having desired dimensions. In such examples, the formation process may be configured to form a sidewall region, where no side of the sidewall region is greater than 25% of the width of storage element 420 (thus, a combined width of two sides of sidewall region 250 may up to 50% of the width of storage element 420). In some examples, the width of the sidewall region relative to the width of the storage element 420 is between 10% and 50%, between 15% and 45%, between 20% and 40%, between 25% and 35%, or about 30%. In some examples, storage element 420 may have a cell dimension of around 20 nanometers. The obtained composition of sidewall region 450 may increase a structural integrity (e.g., strength) of sidewall region 450, increase a resistivity of sidewall region 450 (e.g., to decrease leakage current through sidewall region 450), or both. The obtained dimensions of sidewall region 450 may increase a structural integrity of sidewall region 450 and may result in a bulk region having desired dimensions.

In some examples, the process may be configured so that bulk region 440 is encircled by sidewall region 450. In other examples, the process may be configured so that bulk region 440 is partially encircled by sidewall region 450—e.g., bulk region 440 may be positioned against a side of storage element 420 and surrounded on three sides by sidewall region 450. In other examples, the process may be configured so that sidewall region 450 is positioned along one side, two opposing, or two adjacent sides of bulk region 440. Bulk region 440 may extend from a bottom of storage element 420 to a top of storage element 420. Sidewall region 450 may also extend from the bottom of storage element 420 to the top of storage element 420.

In some examples, a process for forming word line 410 may affect a formation of first sidewall region 450-1 and second sidewall region 450-2. That is, a composition (e.g., which may be represented by S') and dimensions of first sidewall region 450-1 and a composition and dimensions of second sidewall region 450-2 may be based on a process for forming word line 410, where the composition and dimensions of first sidewall region 450-1 and second sidewall region 450-2 may be the same. Similarly, a process for forming bit line 415 may affect a formation of third sidewall region 450-3 and fourth sidewall region 450-4. That is, a composition (e.g., which may be represented by S") and dimensions of third sidewall region 450-3 and a composition and dimensions of fourth sidewall region 450-4 may be based on a process for forming bit line 415, where the composition and dimensions of third sidewall region 450-3 and fourth sidewall region 450-4 may be the same. In some examples, the corners of sidewall region 450 (e.g., where first sidewall region 450-1 and third sidewall region 450-3 meet, where second sidewall region 450-2 and fourth sidewall region 450-4 meet, and so on) may have a different composition (e.g., which may be represented by S''') than the other sidewall regions. In some examples, the process for forming word line 410 and bit line 415 may be configured so that the resulting portions of sidewall regions 450 have a same composition and dimension.

In some examples, a portion of sidewall region 450 may separate a top of bulk region 440 from a top of storage element 420—that is, bulk region 440 may extend from a bottom of storage element 420 to a bottom of the portion of sidewall region 450 that separates the top of bulk region 440 from a top of storage element 420. In such cases, the separating portion of sidewall region 450 may be broken down (e.g., by applying a current through storage element 420) so that at least some of the separating portion of sidewall region 450 may be re-integrated with bulk region 440. Accordingly, bulk region 440 may extend through the portion of sidewall region 450 to the top of storage element 420. The process for forming storage element 420 is described in more detail herein and with reference to FIG. 5.

Figure 5:
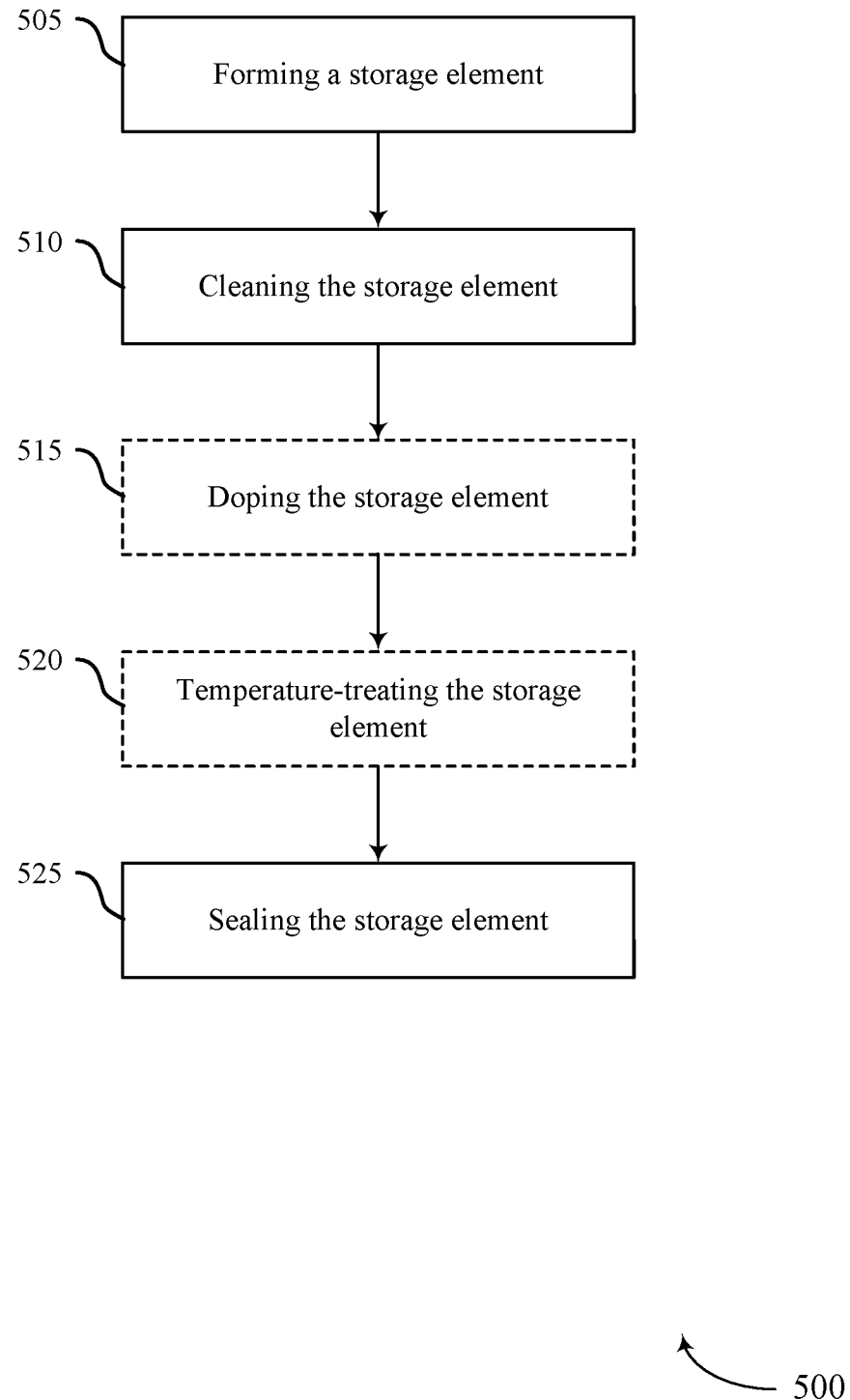
FIG. 5 illustrates one or more operations for forming a vertical pillar that includes a memory cell with sidewall and bulk regions in accordance with examples as disclosed herein.

FIG. 5 illustrates one or more operations for forming a vertical pillar that includes a memory cell with sidewall and bulk regions in accordance with examples as disclosed herein. Flow chart 500 may be performed by a manufacturing system or one or more controllers associated with a manufacturing system. Flow chart 500 shows an example of a sequence of operations performed to support forming self-selecting memory cells with sidewall and bulk regions (e.g., the self-selecting memory cells described with reference to FIGS. 3 and 4). For example, flow chart 500 depicts operations for forming vertically-disposed self-selecting memory cells with sidewall regions that increase a structural integrity of a memory cell, have high resistivities, and are used to control the dimensions of the memory cell.

One or more of the operations described in flow chart 500 may be performed earlier or later in the process, omitted, replaced, supplemented, or performed in combination with another operation. Also, additional operations described herein that are not included in flow chart 500 may be included.

At 505, a storage element of a vertically-disposed memory cell may be formed. In some examples, the storage element may be formed by depositing a chalcogenide material on a word line or bottom electrode that have already been formed. In some examples, the storage element may be formed by etching away (e.g., using a dry or wet etching) portions of a chalcogenide layer, leaving the storage element (and, in some examples, a bottom electrode, top electrode, or both). In some examples, the etching process changes a composition of a portion of the storage element that is exposed to the etching process. For example, a chemical (e.g., a methane or nitride chemical) used for the etching may react/combine with an exposed portion of the storage element. In some examples, the chemical changes a composition of the exposed portion of the storage element, forming a sidewall region of the storage element. In some examples, the chemical used for the etching, a duration of the etching, or both, are selected to obtain a desired composition of the sidewall region. For example, the etching chemical may be selected to increase a structural integrity, resistivity, or both of the sidewall region. Also, the duration of the etching may be selected to increase a penetration of the chemical into the chalcogenide material—e.g., to increase a width of the sidewall region. In some cases, an increased width of the sidewall region is associated with an increase structural integrity of the sidewall region.

In some examples, the etching process may modify a concentration of one or more elements in the exposed surface of the storage element (e.g., by introducing an element to the exposed surface or removing an element from the exposed surface). In some examples, the effect of the etching operation on the sidewall region may be modulated based on a dilution of the chemicals used in an etching solution, a temperature associated with the etching, a pressure associated with the etching, or a combination thereof.

In some examples, the storage elements may be formed as part of a process that includes forming the word lines and the bit lines. For example, a first pair of opposing sides of the storage elements may be formed when the word lines are formed and a second pair of opposing sides of the storage elements may be formed when the bit lines are formed. In some examples, a first sidewall region corresponding to the first pair of opposing sides may be formed based on forming the word lines—portions of the first sidewall region on each of the opposing sides may have a same composition and dimension as one another. In some examples, a second sidewall region corresponding to the second pair of opposing sides may be formed based on forming the bit lines—portions of the first sidewall region on each of the opposing sides may have a same composition and dimension as one another. In some examples, the process for forming the word lines and bit lines may be configured so that the first sidewall region and the second sidewall regions on all sides of the storage element have a same composition and dimension as one another.

In some examples, a sacrificial liner may be deposited on an exterior of the storage elements after the storage element are formed. The sacrificial liner may protect the storage elements while a bottom electrode and word line are formed. After the bottom electrode and word line are formed, the sacrificial liner may be replaced—e.g., before a cleaning and/or sealing operation. In some examples, the sacrificial liner reacts with the exterior of the storage element, affecting the characteristics of a sidewall region of the storage element.

At 510, the storage element may be cleaned. In some examples, cleaning the storage element includes removing impurities located on an exposed surface of the storage element (e.g., as a result of the etching). In some examples, a chemical used for the cleaning (e.g., citric acid, ammonia-based solutions, or peroxides, such as $H_2O_2$ or $NH_4OH$), a duration of the cleaning, or both may change a composition of the storage element. For example, the cleaning chemical may be selected to increase a structural integrity, resistivity, or both of the sidewall region. Also, the duration of the cleaning may be selected to increase a penetration of the cleaning chemical into the chalcogenide material—e.g., to increase a width of the sidewall region. In some examples, the cleaning process may modify a concentration of one or more elements in the exposed surface of the storage element (e.g., by introducing an element to the exposed surface or removing an element from the exposed surface). In some examples, the effect of the cleaning operation on the sidewall region may be modulated based on a dilution of the chemicals used in the cleaning solution, a temperature associated with the cleaning, a pressure associated with the cleaning, or a combination thereof.

At 515, the storage element may be doped. The doping of the storage element may be an optional part of the process that may not occur in some processes. In some examples, doping the storage element includes introducing impurities into an exposed surface of the storage element. In some examples, a chemical used for the doping, a duration of the doping, or both may change a composition of the storage element. For example, the doping chemical may be selected to increase a structural integrity, resistivity, or both of the sidewall region. Also, the duration of the doping may be selected to increase a penetration of the doping chemical into the chalcogenide material—e.g., to increase a width of the sidewall region. In some examples, the doping process may modify a concentration of one or more elements in the exposed surface of the storage element.

At 520, the storage element may be temperature-treated. The temperature-treating of the storage element may be an optional part of the process that may not occur in some processes. In some examples, temperature-treating the storage element includes exposing the storage element to high temperatures (in some examples, the exterior of the storage element may be exposed to higher temperatures than the interior of the storage element). In some examples, a temperature used for the temperature-treating, a duration of the temperature-treating, or both may change a composition of the storage element (e.g., by causing the release of deposition byproducts). For example, the temperature and duration of the temperature may be selected to increase a structural integrity, resistivity, or both of the sidewall region. In some examples, the temperature-treating process may modify a concentration of one or more elements in the exposed surface of the storage element—e.g., if one or more elements migrate out of the exposed surface.

At 525, the storage element may be sealed. In some examples, sealing the storage element includes depositing a sealing layer on an exterior of the storage element (such as the seal 455 described with reference to FIG. 4). In some examples, a chemical used for the sealing may change a composition of the storage element. For example, the sealing chemical may be selected to increase a structural integrity, resistivity, or both of the sidewall region. In some examples, the sealing process may modify a concentration of one or more elements in the exposed surface of the storage element. In some examples, the effect of the sealing operation on the sidewall region may be modulated based on a dilution of the chemicals used in the seal, a temperature associated with the sealing, a pressure associated with the sealing, or a combination thereof. In some examples, a temperature-treating operation may be performed after the sealing layer is applied to the storage element, which may similarly effect the sidewall region as the temperature-treating operation described at 520.

In some examples, at different stages of the formation process, sacrificial materials (e.g. placeholder materials, such as silicon nitride or aluminum oxide) may be deposited that contact the storage element, where the sacrificial materials may change a composition of a sidewall region of the storage element.

Thus, the procedures for forming, cleaning, doping, temperature-treating, and sealing the storage element may be performed to increase a structural integrity and resistivity of the sidewall region—e.g., by obtaining a desired concentration of one or more elements in the sidewall region of the storage element. In some examples, the procedures for forming, cleaning, doping, temperature-treating, and sealing the storage element may increase a concentration of an element (e.g., elements with low volatility, such as indium) in a sidewall region of the storage element relative to a bulk region of the storage element, decrease a concentration of an element (e.g., arsenic) in the storage element in a sidewall region of the storage element relative to a bulk region of the storage element, or both. In some examples, the different formation procedures may increase or decrease a concentration of different elements in the sidewall region. In some examples, a concentration of heavier elements with low volatility in the sidewall region may be higher than a concentration of the heavier elements in the bulk region.

In some examples, upon a completion of the formation process, the concentration of an element (e.g., arsenic, selenium, indium) or group of elements in the sidewall region may be between two and twenty percent different than the concentration of the element in the bulk region. For example, the concentration of arsenic in the sidewall region may be between two and twenty percent less than the concentration of arsenic in the bulk region. In another example, the concentration of selenium may be twenty percent more than the concentration of selenium in the bulk region. In some examples, the storage element is contaminated with oxygen during one or more of the formation processes. Oxygen may significantly alter the electrical, mechanical, and thermal stability properties of the sidewall region. In some examples, the concentration of oxygen in the storage element may be at a peak at an edge of the sidewall region (e.g., a sealing interface) and may decrease (e.g., linearly or non-linearly) to zero at a point within the bulk region.

The procedures for forming, cleaning, doping, temperature-treating, and sealing the storage element may also be performed to obtain desired dimensions for the sidewall region (e.g., dimensions that result in a bulk region having desired dimensions)—e.g., by selecting particular durations, temperatures, pressures, or any combination thereof, for performing the different operations. For example, a duration of one or more of the operations may be extended (e.g., to expose the storage element to the corresponding chemicals for a longer duration) or a pressure associated with the one or more operations may be increased (e.g., by increasing a force with which the corresponding chemicals are pressed against/into the storage element) to increase a width of the sidewall region. In some examples, achieving the desired dimensions for the storage component results in a storage component having a lower resistivity or lower structural strength than desired, and vice versa—that is, adjusting (e.g., optimizing) one characteristic of the storage component may diminish another characteristic of the storage component. Accordingly, in some examples, the procedures for forming, cleaning, doping, temperature-treating, and sealing the storage element may be performed in concert to obtain a sidewall region having dimensions that fall within a desired range, a resistivity within a desired range, and a structural strength within a desired range.

Figure 6A:
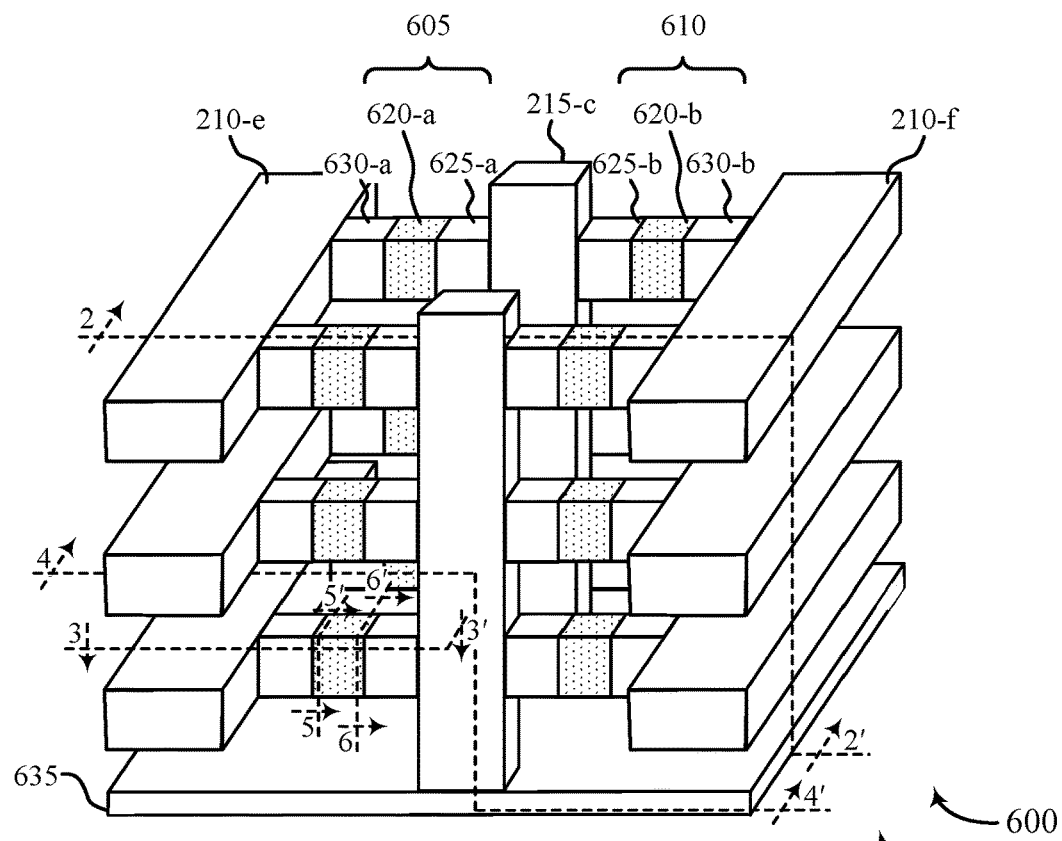
FIGS. 6A and 6B illustrate multiple views of a vertical memory array having horizontally-disposed memory cells in accordance with examples as disclosed herein.
Figure 6B:
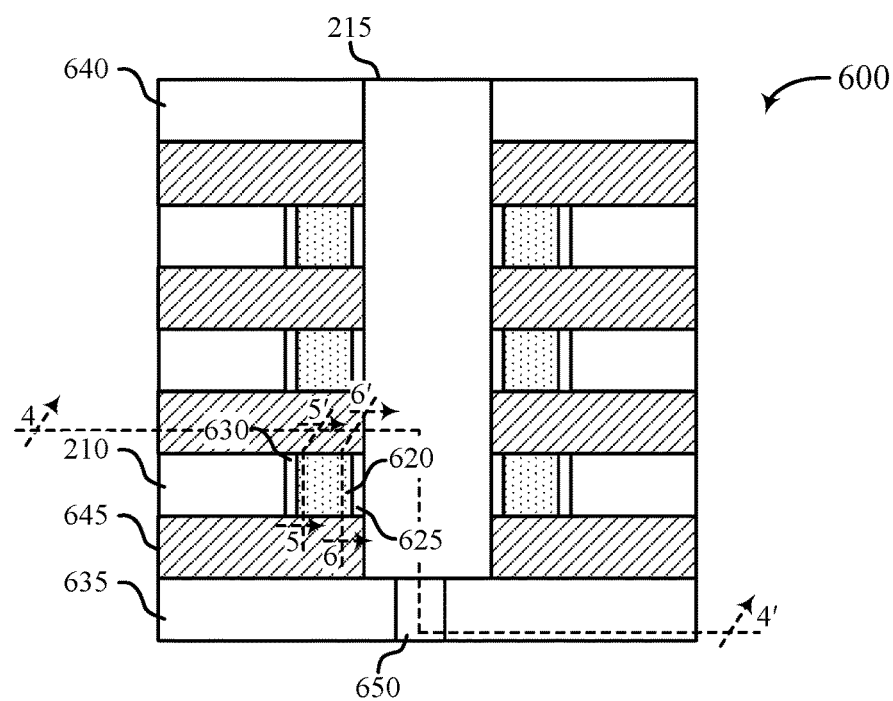

FIGS. 6A and 6B illustrate multiple views of a vertical memory array having horizontally-disposed memory cells in accordance with examples as disclosed herein. Memory array 600 may be an example of portions of the memory arrays or memory dies described with reference to FIGS. 1 and 2.

First perspective 601-a shows a three-dimensional view of memory array 600. The memory array 600 may include a first group 605 of memory cells that is positioned above a first substrate 635 and a second group 610 of memory cells that is positioned adjacent to the first group 605 and above the first substrate 635. Though the example of memory array 600 includes two groups (first group 605 and second group 610), the memory array 600 may include any quantity of groups (e.g., one group or more than two groups).

Memory array 600 may also include row lines 210 and column lines 215, which may be examples of row lines 210 and column lines 215, as described with reference to FIG. 2. In some examples, a row line 210 may also be referred to as a word line and a column line 215 may be referred to as a bit line or a digit line. One or more memory cells of the memory array 600 may include one or more chalcogenide materials in a horizontal rail (which may also be referred to as a horizontal pillar) between access lines. For example, a single stack between access lines may include a first electrode, a first chalcogenide material (e.g., selector component), a second electrode, a second chalcogenide material (e.g., storage element), a third electrode, or any combination thereof. Although some elements included in FIG. 6A are labeled with a numeric indicator, other corresponding elements are not labeled, although they are the same or similar, in an effort to increase visibility and clarity of the depicted features.

One or more memory cells of the first group 605 may include a first electrode 625-$a$, a storage element 620-$a$, or a second electrode 630-$a$. One or more memory cells of the second group 610 may include a first electrode 625-$b$, a storage element 620-$b$, and a second electrode 630-$b$. The storage elements 620 may be examples of a chalcogenide material, such as a phase change storage element, a thresholding storage element, or a self-selecting storage element. The memory cells of the first group 605 and second group 610 may, in some examples, have common conductive lines such that corresponding memory cells of first group 605 and second group 610 may share column lines 215 or row lines 210. For example, the first electrode 625-$b$ of the second group 610 and the second electrode 630-$b$ of the first group 605 may be coupled with column line 215-$c$ such that the column line 215-$c$ may be shared by horizontally adjacent memory cells. In some examples, the electrode contacting a column line 215 (e.g., first electrode 625) may be referred to as a top electrode and the electrode contacting a row line 210 (e.g., a second electrode 630) may be referred to as a bottom electrode.

The row lines 210 and columns lines 215 in memory array 300 of FIG. 3 may both extend parallel to a plane defined by the substrate 335, the column lines 215 of memory array 600 may be formed as pillars and extend normal to the plane defined by first substrate 635. Also, whereas the row lines 210 and columns lines 215 in memory array 300 of FIG. 3 may be positioned above/below one another along an axis that runs normal to the plane defined by the substrate 335, the row lines 210 and column lines 215 of memory array 600 may be positioned adjacent to one another along an axis that runs parallel with the plane defined by first substrate 635. In some examples, memory array 600 may enable higher-density data storage than memory array 300.

The storage elements 620 may use similar materials (e.g., chalcogenide materials or alloys) as storage element 320 of FIG. 3. Also, the storage elements 620 may be included in phase change memory cells and/or self-selecting memory cells. In some examples, current flows through storage element 620 in a direction that is parallel to a plane defined by first substrate 635, whereas current may flow through storage elements 320 in FIG. 3 in a direction that is normal to a plane defined by substrate 335.

While the example of FIG. 6A shows two memory groups, other configurations are possible. In some examples, a single memory group of memory cells may be constructed above the first substrate 635, which may be referred to as a two-dimensional memory. In some examples, two or more groups of memory cells may be configured in a similar manner in a three-dimensional cross point architecture. Further, in some cases, elements shown in or described with reference to FIG. 6A may be electrically coupled with one another as shown or described but rearranged physically (e.g., a storage element 620 and possibly a selection element or an electrode may be electrically in series between a row line 210 and a column line 215 but may not be in a rail or stack.

Second perspective 601-b shows a cross-sectional view of memory array 600 along the line 2-2' shown in second perspective 601-a. The cross-sectional view of second perspective 601-b may be looking from a front of memory array 600. Second perspective 601-b shows additional material layers included in memory array 600 that are not depicted in first perspective 601-a (to increase visibility and clarity of the depicted features). Second perspective 601-b shows dielectric layers 645 between row lines 210. Second perspective 601-b also shows a second substrate 640 on an opposing side of a memory stack relative to first substrate 635.

The architecture of memory array 600 may be referred to as a cross point architecture, a vertical memory architecture, or both, and memory array 600 may be referred to as a vertical memory array. A vertical memory array may be formed by depositing alternating layers of conductive and insulative materials on top of one another to obtain a stack of material layers; forming a trench that passes through the stack of material layers (e.g., in a serpentine fashion); and using the trench to form horizontally-disposed memory cells relative to a substrate (e.g., first substrate 635 or second substrate 640). In some examples, conductive contacts 650 are embedded within first substrate 635 and are used to couple an access line (e.g., a column line 215) with one or more decoders or other components. In some examples, a first material layer (e.g., an insulative material layer that includes dielectric layer 645) may be formed on top of first substrate 635, a second material layer (e.g., a conductive material layer that includes row line 210) may be formed on top of the first material layer, a third material layer (e.g., an insulative material layer that includes another dielectric layer) may be formed on top of the second material layer, and so on. After the stack of material layers is formed, portions of the material layers may be removed (e.g., using an etching process) to form a trench.

In some examples, the trench may extend through the space occupied by column line 215—before column line 215 is formed. In some examples, the trench may be used to split the conductive and insulative layers into two portions and to horizontally etch (e.g., isometrically) away portions of the remaining conductive material layers, forming multiple row lines 210 and cavities in one or more sidewalls of the trench. The cavities may extend through the space occupied by storage elements 620—before storage elements 620 are formed. The trench and cavities may then be filled in with a filling material (e.g., with an insulative material, dielectric material, etc.). The filling material may use a different insulative material than the dielectric layers 645.

Next, vertical openings may be created in portions of the filled-in trench (e.g., over conductive contacts 650). A vertical opening of the vertical openings may be positioned in the space occupied by column line 215—before column line 215 is formed. The vertical openings may be used to remove portions of the filling material, forming multiple cavities that are separated (e.g., by the insulative material) from one another in a horizontal, vertical, and inward/outward direction. The cavities may be positioned in the space occupied by storage elements 620—before storage elements 620 are formed.

A chalcogenide material may then be used to fill the multiple cavities (forming storage elements 620), and a conductive material may be used to fill the vertical openings that remains after the cavities are filled (forming column line 215). In some examples, instead of filling the multiple cavities with the chalcogenide material, a conductive material may be deposited into the multiple cavities (forming second electrodes 630), then the chalcogenide material may be deposited into the multiple cavities (forming storage elements 620), and next another conductive material may be used to fill a remainder of the cavity (forming first electrodes 625). After depositing the chalcogenide material (and/or the other conductive material), the cavity may be etched to preparation to form an access line (e.g., column line 215). A conductive material may be deposited in the cavity to form the access line (e.g., column line 215). In some examples, second electrodes 630 may be in contact with row lines 210, and first electrodes 625 may be in contact with column lines 215.

Thus, a process used to form a vertical memory array may result in a vertical stack of horizontally-disposed memory cells that are separated (isolated) from one another by an insulative material (e.g., a dielectric material 645). In some examples, the processes for removing and forming portions of the material layers may include operations for cleaning, sealing, temperature-treating, doping (e.g., with contaminants) exposed portions of the material layer, or any combination thereof.

As described herein, a horizontally-disposed memory cell may include a second electrode 630, a storage element 620, and a first electrode 625. In some examples, the horizontally-disposed memory cell may be an example of a self-selecting memory cell. As described herein and with reference to FIG. 3, a self-selecting memory cell may be programmed to have a high threshold voltage state or a low threshold voltage state, and measures may not be taken to isolate self-selecting memory cells from voltages applied to other, electrically-coupled memory cells.

A voltage (or sequence of voltages) may be applied to a storage element to program the threshold voltage of the storage element to a desired level. The application of the voltages to the storage element may stress (mechanically, thermally, electrically, etc.) the storage element. Over time, the application of the voltages may reduce a structural integrity of the storage element. Also, when the second layer of a self-selecting memory cell is composed entirely of the chalcogenide material, for example, the reduction in the structural integrity of the storage element may reduce a structural integrity of the self-selecting memory cell. Additionally, in some examples, a performance of a storage element may be decreased when the dimensions of the storage element have the same (or nearly the same) dimensions as the other elements in a horizontally-disposed memory cell.

In some examples, aspects of a memory cell (e.g., the sides or exterior of a portion of the storage element) may be exposed to the formation and removal processes that occur after a portion of the memory cell is formed—e.g., the cleaning, sealing, or temperature-treating processes. In some examples, a composition of aspects of a storage element that are exposed to the additional formation and removal processes may be changed relative to aspects of the storage element (which may be referred to as bulk region) that are not (or are less) exposed to the additional formation and removal processes (e.g., interior portions of the storage element). That is, a portion of a chalcogenide material that forms the storage element and is exposed to the additional processes may be contaminated, a concentration of components of the alloy may be changed, or both.

In some examples, the modified portions of the storage element may be referred to as a sidewall region of the storage element and the unmodified portions of the storage element may be referred to as a bulk region of the storage element. In some examples, the sidewall region of the storage elements may have a different (e.g., a reduced) conductivity than the bulk region of the storage elements. Additionally, the sidewall region of the storage element may not be programmable—that is, the sidewall region of the storage element may not change their state when voltages are applied across the memory cell. Accordingly, the sidewall region of the storage element may not be subjected to the same stresses as the bulk region of the storage element and may be structurally stronger than the bulk region of the storage element—e.g., over time.

For a vertically-disposed memory cell (e.g., as described with reference to FIG. 3), a sidewall region of a storage element may extend from a bottom electrode to a top electrode of a vertically-disposed memory in a vertical direction that is parallel to a conductive path through the vertically-disposed memory cell. Also, in some examples, the sidewall region may encircle (or partially encircle) the storage element of the vertically-disposed memory cell—as a result of a process for forming a planar 3D array. The sidewall region of the storage element may also extend in a direction that is parallel to a current path through the vertically-dispose memory cell. Thus, the sidewall region of the storage element may protect the bulk region of the storage element and may mechanically stabilize a vertically-disposed memory cell against stresses that may occur during programming operations.

For a horizontally-disposed memory cell (as described in FIGS. 6A and 6B), the sidewall region of a storage element may extend from a bottom of the storage element to a top of the storage element in a vertical direction that is orthogonal to a conductive path through the horizontally-disposed memory cell. Also, in some examples, the sidewall region may separate a bulk region of the storage element from an electrode of the horizontally-disposed memory cell (e.g., a top electrode) that is contact with a corresponding bit line—as a result of a process for forming a horizontally-disposed memory cell. Thus, relative to the sidewall region of a storage element of a vertically-disposed memory cell, the sidewall region of a storage element of a horizontally-disposed memory cell may provide decreased protection for the bulk region. Also, despite increasing a structural integrity of a horizontally-disposed memory cell against stresses that may occur during programming operations, the sidewall region of the storage element may provide decreased mechanical stabilization for the horizontally-disposed memory cell relative to the sidewall region of a storage element of a vertically-disposed memory cell. Also, the sidewall region of the storage element of the horizontally-disposed memory cell may decrease a performance of the horizontally-disposed memory cell—e.g., based on separating a bulk region of the storage element from an electrode of the horizontally-disposed memory cell.

To improve a performance of horizontally-disposed, self-selecting memory cells, procedures for forming a vertical memory array may be modified to remove the sidewall region of at least a subset of the horizontally-disposed, self-selecting memory cells. In some examples, the sidewall region may be removed by applying an electric current through a selected subset of the horizontally-disposed, self-selecting memory cells. Another subset of the horizontally-disposed, self-selecting memory cells that are not subjected to an electric current may retain the sidewall region and may increase a strength of a memory array. In some examples, the memory cells that are not subjected to an electric current correspond to memory cells that will not be used for data storage during operation of the memory array. In some examples, the memory cells that are not subjected to an electric current are positioned on a periphery of the memory array. In some examples, the memory cells that are not subjected to an electric current are distributed throughout the memory array in a manner that increases a structural integrity of the memory array.

Additionally, or alternatively, to improve a performance of horizontally-disposed, self-selecting memory cells, procedures for forming a vertical memory array may be modified to form a sidewall region that extends from a first side of a storage element to a second side of the storage element in a horizontal direction that is parallel to a conductive path through the horizontally-disposed memory cell. One option for forming such a sidewall region may include using a dielectric material that reacts with a chalcogenide material to from the sidewall region. Another option for forming such a sidewall region may include depositing a contaminant layer into a cavity for the storage element prior to a chalcogenide material, where the contaminant layer reacts with the chalcogenide material to form the sidewall region. Another option for forming such a sidewall region may involve depositing a chalcogenide material having a first composition into a cavity for the storage element to form the sidewall region and depositing a second chalcogenide material having a second composition into the cavity to form the bulk region. Another option for forming such a sidewall region may involve filling a cavity for the storage element from a lateral direction and processing an exposed portion of the storage element to form the sidewall region.

By forming a sidewall region that extends from a first side of a storage element to a second side of the storage element in a horizontal direction that is parallel to a conductive path through the memory cell, desired structural and dimensional characteristics of a storage element may be achieved and maintained throughout the operation of a vertical memory array.

Figure 7:
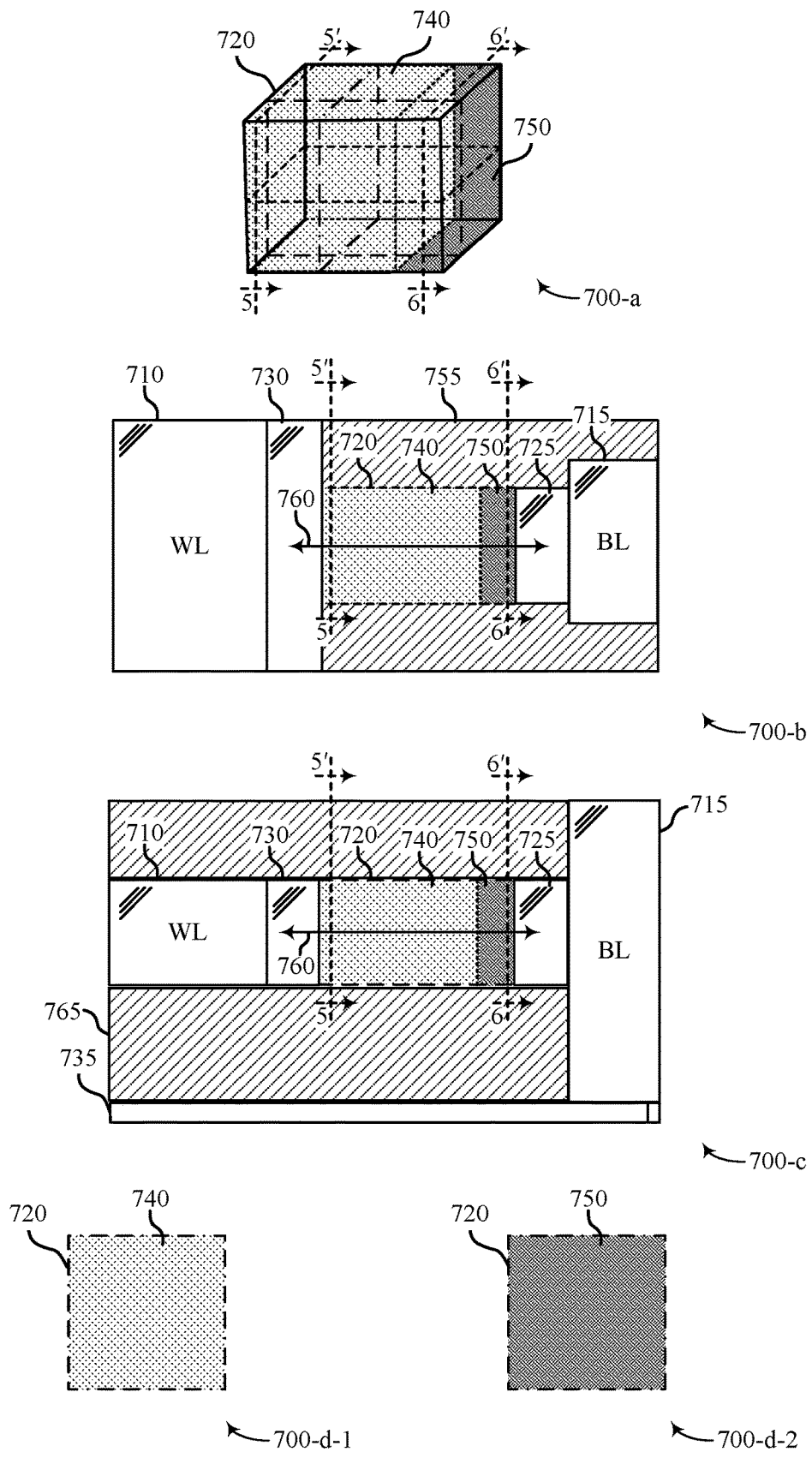
FIG. 7 illustrates multiple views of a storage element having a sidewall and bulk region in accordance with examples as disclosed herein.

FIG. 7 illustrates multiple views of a storage element having a sidewall and bulk region in accordance with examples as disclosed herein. First perspective 700-a shows a three-dimensional view of storage element 720. Storage element 720 may be an example of a storage element 620 as described with reference to FIG. 6A (e.g., the storage element associated with cross-section lines 3 through 6).

Storage element 720 may include bulk region 740 and sidewall region 750 (indicated by the darker shading). As described herein, both bulk region 740 and sidewall region 750 may include a chalcogenide material, where a composition of the chalcogenide material in bulk region 740 may be different than a composition of the chalcogenide material in sidewall region 750. In some examples, the chalcogenide material in bulk region 740 may be programmable to have different threshold voltages, while the chalcogenide material in sidewall region 750 may not be programmable. In some examples, the chalcogenide material in sidewall region 750 may be more structurally reliable (e.g., over an operating life of storage element 720) than the chalcogenide material in bulk region 740. The chalcogenide material in sidewall region 750 may also have a high resistivity to prevent leakage through sidewall region 750 when a voltage is applied across storage element 720.

Second perspective 700-*b* shows a cross-sectional view of memory array 600 along the line 3-3' shown in first perspective 601-*a* of FIG. 6A. The cross-sectional view of second perspective 700-*b* may include aspects of a horizontal rail that includes storage element 720 and may be obtained by looking from a top or bottom of memory array 600 after obtaining the cross-section shown in second perspective 700-*b*. The horizontal rail may include bit line 715, top electrode 725, bottom electrode 730, and word line 710, which may be examples of a column line 215, first electrode 625, second electrode 630, and row line 210 described in FIGS. 2 and 6A.

In some examples, top electrode 725 may be coextensive with bit line 715—e.g., if top electrode 725 is not deposited into a cavity. In some examples, the horizontal rail may be encased by dielectric material 755. In some examples, the horizontal rail may extend (and the components of the horizontal rail may be positioned) in a direction that is parallel to a plane defined by substrate 735. As depicted by current path 760, current may flow through storage element 720 in the direction that is parallel to the plane defined by substrate 735. In some examples, bit line 715 is in contact with one or more conductive contacts embedded in substrate 735.

Third perspective 700-*c* shows a cross-sectional view of memory array 600 along the line 4-4' shown in first perspective 601-*a* of FIG. 6A. The cross-sectional view of third perspective 700-*c* may include aspects of a horizontal rail that includes storage element 720 and may be obtained by looking from a front or back of memory array 600 after obtaining the cross-section shown in third perspective 700-*c*. In some examples, the horizontal rail may be positioned between multiple dielectric layers, such as dielectric layer 765. As shown in third perspective 700-*c*, the horizontal rail may be above, but not in direct contact, with substrate 735, while bit line 715 may extend vertically to contact the substrate 735.

Fourth perspectives 700-*d* show cross-sectional views of storage element 720 along the lines 5-5' and 6-6'. The cross-sectional view of fourth perspectives 700-*d* may be obtained by looking in the direction of current path 760 through storage element 720 (e.g., looking from a left or right side of storage element 720) after obtaining the cross-section shown in fourth perspectives 700-*d*.

Fourth perspective 700-*d*-1 shows a cross-sectional view of storage element 720 along the line 5-5' shown in first perspective 700-*a* and second perspective 700-*b* (and may also correspond to lines 5-5' shown in FIG. 6A). The cross-sectional view of fourth perspective 700-*d*-1 may be obtained by looking in the direction of current path 760 through storage element 720, starting at one side (e.g., a leftmost side, or beginning) of storage element 720, after obtaining the cross-section shown in fourth perspective 700-*d*-1.

Fourth perspective 700-*d*-2 shows a cross-sectional view of storage element 720 along the line 6-6' shown in first perspective 700-*a* and second perspective 700-*b* (and may also correspond to lines 6-6' shown in first perspective 601-*a* of FIG. 6A). The cross-sectional view of fourth perspective 700-*d*-2 may be obtained by looking in the direction of current path 760 through storage element 720, starting at an opposing side (e.g., a rightmost side, or end) of storage element 720, after obtaining the cross-section shown in fourth perspective 700-*d*-2.

As shown in fourth perspective 700-*d*-1, at a first end of storage element 720, bulk region 740 may extend across an entire cross-section of storage element 720, while, as shown in fourth perspective 700-*d*-2, at a second end of storage element 720, sidewall region 750 may extend across an entire cross-section of storage element 720. As shown by the different perspectives 700, sidewall region 750 may separate bulk region from top electrode 725. In some examples, the presence of sidewall region 750 may affect (e.g., reduce) a performance of storage element 720.

In some examples, a process associated with forming storage element 720 may be configured to obtain a desired sidewall region and bulk region configuration. In some examples, the formation process is configured to obtain a sidewall region of a desired composition, desired resistivity, desired dimensions, or any combination thereof. In some examples, the formation process is configured to obtain a bulk region having desired dimensions. The obtained composition of sidewall region 750 may increase a structural integrity (e.g., strength) of storage element 720, increase a resistivity of sidewall region 750 (e.g., to decrease leakage current through sidewall region 750), or both. The obtained dimensions of sidewall region 750 may increase a structural integrity of storage element 720 and may result in a bulk region having desired dimensions.

In some examples, the process may include an operation for applying an electrical current through at least a subset of the storage elements included in a memory array. Applying the electrical current may result in the breakdown of at least a portion of the sidewall regions (e.g., sidewall region 750), such that the broken-down portion of the sidewall regions mix with respective bulk regions (e.g., bulk region 740). After the mixing, the broken-down portion of the sidewall region may have a composition that is the same as (or similar) to a composition of the bulk region; thus, the bulk region may extend through the sidewall region to contact a bit line. The process for forming storage element 720 is described in more detail herein and with reference to FIG. 8.

Figure 8:
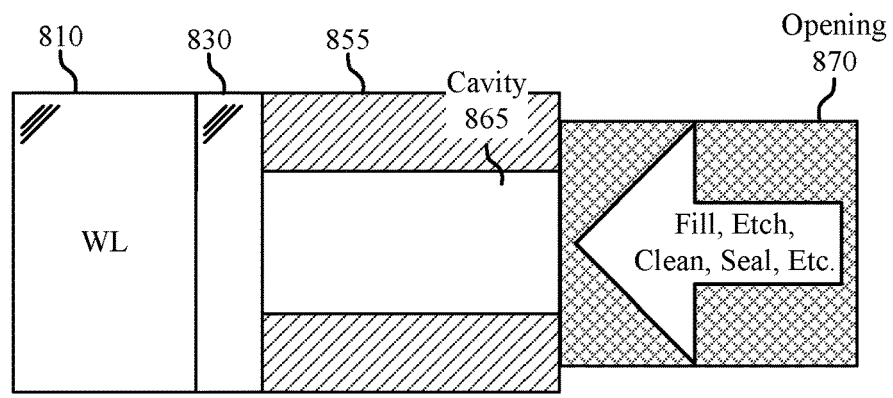
FIG. 8 illustrates a diagram for forming a horizontal rail that includes a memory cell having a bulk region and a sidewall region as well as multiple views of the storage element in accordance with examples as disclosed herein.
Figure 8:
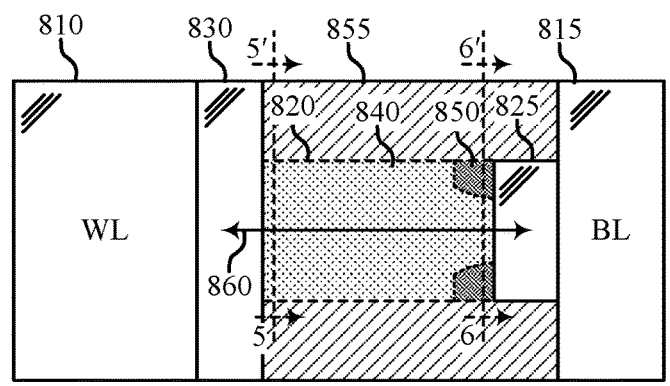
Figure 8:
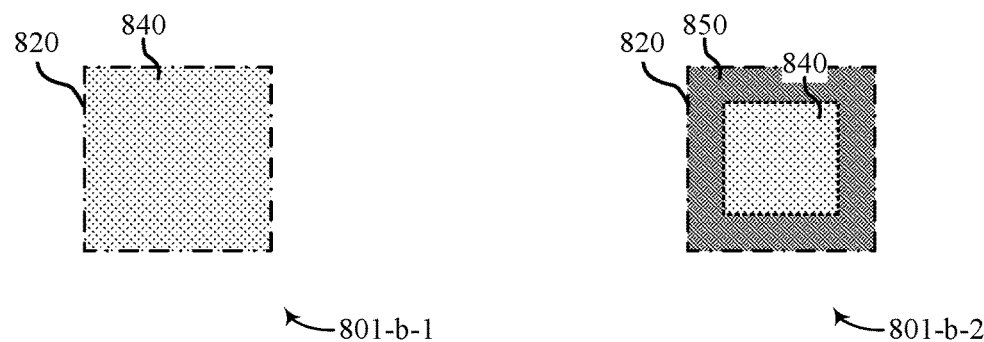

FIG. 8 illustrates a diagram for forming a horizontal rail that includes a memory cell having a bulk region and a sidewall region as well as multiple views of the storage element in accordance with examples as disclosed herein.

Formation diagram 800 may depict a set of operations for forming one or more components of a memory cell (including a storage element, such as storage element 820). Formation diagram 800 shows a word line 810, a bottom electrode 830, and dielectric materials, such as dielectric material 855. Formation diagram 800 also shows cavity 865 and opening 870—opening 870 may be a vertical opening that extends normal to and contacts a face of a substrate. In some examples, an operation for forming cavity 865 (e.g., an etching process) uses opening 870 to access cavity 865.

First perspective 801-*a* shows a cross-sectional view of memory array 600 along the line 3-3' shown in first perspective 601-*a* of FIG. 6A. The cross-sectional view of first perspective 801-*a* may include aspects of a horizontal rail that includes storage element 820 and may be obtained by looking from a top or bottom of memory array 600 after obtaining the cross-section shown in first perspective 801-*a*.

Second perspective 801-*b*-1 shows a cross-sectional view of storage element 820 along the line 5-5' shown in first perspective 801-*a* (and may also correspond to lines 5-5' shown in FIGS. 6A and 7). The cross-sectional view of second perspective 801-*b*-1 may be obtained by looking in the direction of current path 860 through storage element 820, at one side (e.g., a leftmost side, or beginning) of storage element 820, after obtaining the cross-section shown in second perspective 801-*b*-1.

Second perspective 801-*b*-2 shows a cross-sectional view of storage element 820 along the line 6-6' shown in first perspective 801-*a* (and may also correspond to lines 6-6' shown in FIGS. 6A and 7). The cross-sectional view of second perspective 801-*b*-2 may be obtained by looking in the direction of current path 860 through storage element 820, at an opposing side (e.g., a rightmost side, or end) of storage element 820 after obtaining the cross-section shown in second perspective 801-*b*-2.

In some examples, the process for forming a horizontally-disposed, self-selecting memory cell includes filling at least a portion of cavity 865 by depositing a chalcogenide material into cavity 865 (e.g., to form storage element 820). In some examples, prior to depositing the chalcogenide material, a conductive material (e.g., Carbon) may be deposited into cavity 865 (e.g., if bottom electrode 830 has not yet been formed). In either case, after depositing the chalcogenide material into cavity 865, additional operations may be performed to etch away excess chalcogenide material, clean an exposed surface of the chalcogenide material of impurities (e.g. left by the cleaning process), seal an exposed surface of the chalcogenide material (e.g., to protect the chalcogenide material from other processes), temperature-treat the chalcogenide material, or any combination thereof. In some examples, the additional processes may result in a portion of the chalcogenide material that is exposed to the additional steps to change, forming sidewall region 850 at the end (e.g., the rightmost side) of storage element 820.

After forming the storage element, a conductive material (e.g., Carbon) may be deposited in cavity 865 (or coincident with an exposed face of cavity 865) to form top electrode 825. In some examples, the composition of sidewall region 850 is further changed based on the deposition of the conductive material, where sidewall region 850 may separate bulk region 840 from top electrode 825. In some examples, bulk region 840 is associated with a first composition and sidewall region 850 is associated with a second composition. Another conductive material (e.g., Tungsten), may be deposited after top electrode 825 is formed to form bit line 815.

In some examples, after bit line 815 has been formed, an electrical current may be applied through storage element 820 to breakdown a portion of sidewall region 850. Applying the electrical current through storage element 820 may result in a mixing of the bulk region 840 and sidewall region 850 such that the broken-down portion of sidewall region 850 has a same (or similar) composition as bulk region 840.

Accordingly, bulk region 840 may extend from bottom electrode 830 to top electrode 825, as depicted in first perspective 801-*a*. Also, as shown in second perspective 801-*b*-1, at a first end of storage element 820, bulk region 840 may extend across an entire cross-section of storage element 820, while, as shown in second perspective 801-*b*-2, at a second end of storage element 820, bulk region 840 may extend across an interior portion of a cross-section of storage element 820. Although bulk region 840 is depicted as being in a center of storage element 820 in second perspective 801-*b*, in some examples, bulk region 840 may be offset from the center of storage element 820. Also, in some examples, the bulk region may extend from one side of the cross-section of storage element 820 to another side of the cross-section of storage element 820 in one direction, while not extending from a third side of the cross-section of storage element 820 to a fourth side of the cross-section of storage element 820 in another direction.

In some examples, the operation associated with applying electrical currents through storage elements may be performed for a subset of memory cells in a memory array. In some examples, the electrical currents may be applied through memory cells in the memory array that will be used for data storage. In such cases, storage components of memory cells that may not be used for data storage may retain a sidewall that separates a bulk region from a top electrode. Thus, some memory devices may include a first set of memory cells where the bulk region extends from electrode-to-electrode (e.g., the memory cells used to store information) and a second set of memory cells where the sidewall region separates the bulk region from at least one of the electrodes (e.g., the memory cells that may not be used to store information). In some cases, the storage components may increase a structural integrity of the memory array. In some examples, the storage components may be positioned along a periphery of the memory array, distributed throughout the memory array, or a combination thereof. In some examples, the memory cells comprising the unaltered storage components may be selected based on increasing a structural reliability of the memory array by a threshold amount.

Figure 9:
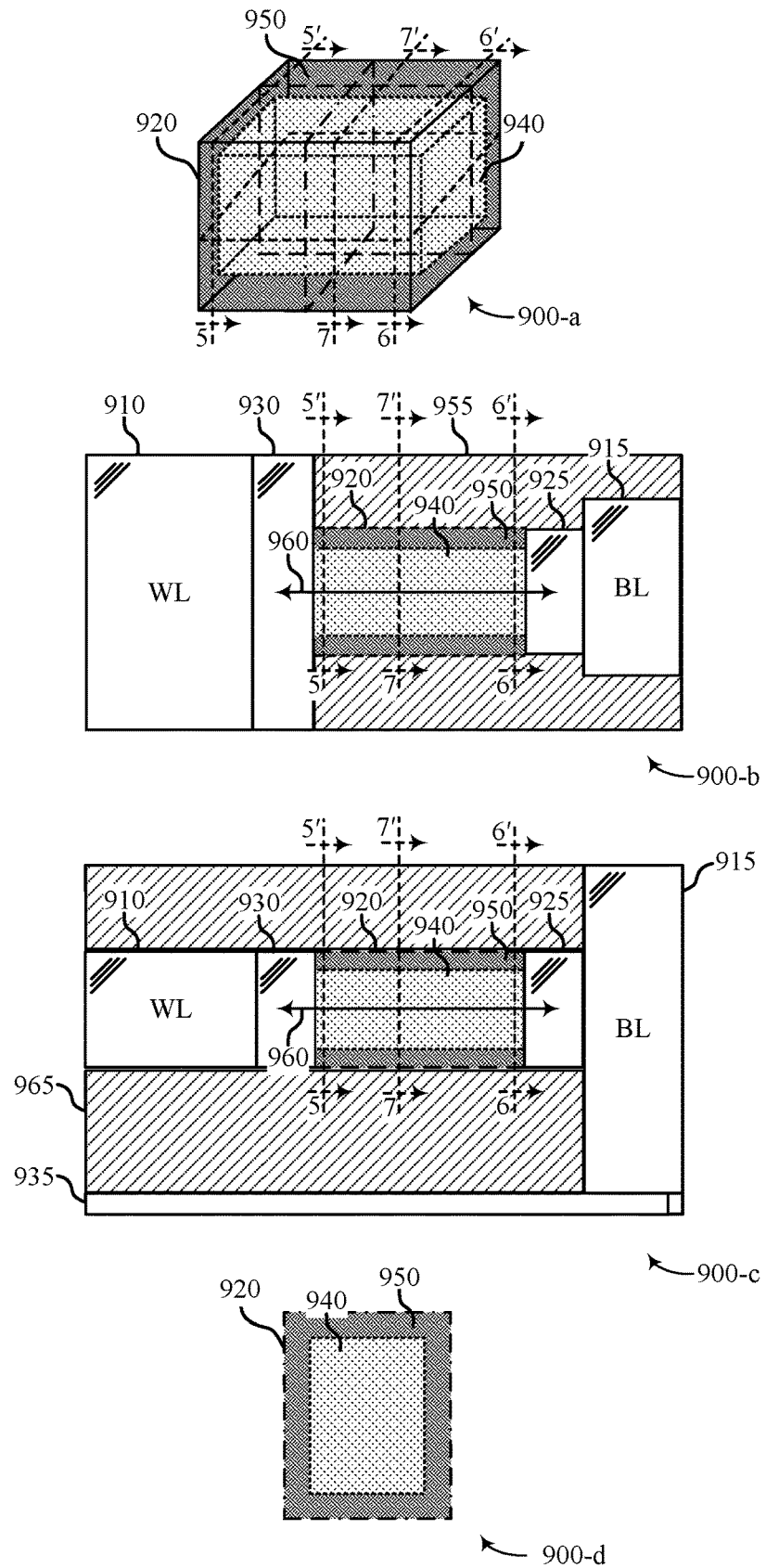
FIG. 9 illustrates multiple views of a storage element having a sidewall and bulk region in accordance with examples as disclosed herein.

FIG. 9 illustrates multiple views of a storage element having a sidewall and bulk region in accordance with examples as disclosed herein. First perspective 900-*a* shows a three-dimensional view of storage element 920. Storage element 920 may be an example of a storage element 620 as described with reference to FIG. 6A (e.g., the storage element associated with cross-section lines 3 through 6).

Storage element 920 may include bulk region 940 and sidewall region 950 (indicated by the darker shading). A structure of storage element 920 may be similar to a structure of storage element 420 of FIG. 4, the sidewall region of storage element 920 extending from a first electrode to a second electrode and in a direction that is parallel to a direction of a current path through storage element 920. However, unlike storage element 420, storage element 920 may be disposed horizontally rather than vertically. Thus, the structure of storage element 920 may provide similar benefits as the structure of storage element 420; however, methods used to form storage element 420 may be incompatible with the formation storage element 920. Methods for forming horizontally-disposed storage elements with the sidewall structure shown in FIG. 9, and other similar structures, are described herein.

As described herein, both bulk region 940 and sidewall region 950 may include a chalcogenide material, where a composition of the chalcogenide material in bulk region 940 may be different than a composition of the chalcogenide material in sidewall region 950. In some examples, the chalcogenide material in bulk region 940 may be programmable to have different threshold voltages, while the chalcogenide material in sidewall region 950 may not be programmable. In some examples, the chalcogenide material in sidewall region 950 may be more structurally reliable (e.g., over an operating life of storage element 920) than the chalcogenide material in bulk region 940. The chalcogenide material in sidewall region 950 may also have a high resistivity to prevent leakage through sidewall region 950 when a voltage is applied across storage element 920.

Second perspective 900-*b* shows a cross-sectional view of memory array 600 along line 3-3' shown in first perspective 601-*a* of FIG. 6A. The cross-sectional view of second perspective 900-*b* may include aspects of a horizontal rail that includes storage element 920 and may be obtained by looking from a top or bottom of memory array 600 after obtaining the cross-section shown in second perspective 900-b. Storage element 920 may include sidewall region 950 and bulk region 940. The horizontal rail may include bit line 915, top electrode 925, bottom electrode 930, and word line 910, which may be examples of a column line 215, first electrode 625, second electrode 630, and row line 210 described in FIGS. 2 and 6A. In some examples, top electrode 925 may be coextensive with bit line 915—e.g., if top electrode 925 is not deposited into a cavity. In some examples, the horizontal rail may be encased by dielectric material 955. In some examples, the horizontal rail may extend (and the components of the horizontal rail may be positioned) in a direction that is parallel to a plane defined by substrate 935. As depicted by current path 960, current may flow through storage element 920 in the direction that is parallel to the plane defined by substrate 935. In some examples, bit line 915 is in contact with one or more conductive contacts embedded in substrate 935.

Third perspective 900-c shows a cross-sectional view of memory array 600 along the line 4-4' shown in first perspective 601-a of FIG. 6A. The cross-sectional view of third perspective 900-c may include aspects of a horizontal rail that includes storage element 920 and may be obtained by looking from a front or back of memory array 900 after obtaining the cross-section shown in third perspective 900-c. In some examples, the horizontal rail may be positioned between multiple dielectric layers, such as dielectric layer 965. As shown in third perspective 900-c, the horizontal rail may be above, but not in direct contact, with substrate 935, while bit line 915 may extend vertically to make contact with substrate 935.

Fourth perspective 900-d shows a cross-sectional view of storage element 920 along the line 7-7' shown in first perspective 900-a and second perspective 900-b. The cross-sectional view of fourth perspective 900-d may be obtained by looking in the direction of current path 960 through storage element 920 (e.g., looking from a left or right side of storage element 920) after obtaining the cross-section shown in fourth perspective 900-d.

In some examples, a process associated with forming storage element 920 may be configured to obtain a desired sidewall region and bulk region configuration. In some examples, the formation process is configured to obtain a sidewall region of a desired composition, desired resistivity, desired dimensions, or any combination thereof. In some examples, the formation process is configured to obtain a bulk region having desired dimensions. The obtained composition of sidewall region 950 may increase a structural integrity (e.g., strength) of sidewall region 950, increase a resistivity of storage element 920 (e.g., to decrease leakage current through sidewall region 950), or both. The obtained dimensions of sidewall region 950 may increase a structural integrity of storage element 920 and may result in a bulk region having desired dimensions.

In some examples, the process may be configured so that bulk region 940 is encircled by sidewall region 950. In other examples, the process may be configured so that bulk region 940 is partially encircled by sidewall region 950—e.g., bulk region 940 may be positioned against a top of storage element 920 and surrounded on three sides by sidewall region 950. In other examples, the process may be configured so that sidewall region 950 is positioned along one side, two opposing sides, or two adjacent sides of bulk region 940. Bulk region 940 may extend from a first side (e.g., a left side) of storage element 920 to a second side (e.g., a right side) of storage element 920. Sidewall region 950 may also extend from the first side of storage element 920 to the second side of storage element 920.

In some examples, a portion of sidewall region 950 may separate a side of bulk region 940 from an end (e.g., a rightmost side) of storage element 920—that is, bulk region 940 may extend from one end of storage element 920 to a side of the portion of sidewall region 950 that separates the end of bulk region 940 from the other end of storage element 920. In such cases, the separating portion of sidewall region 950 may be broken down (e.g., by applying a current through storage element 920) so that at least some of the separating portion of sidewall region 950 may be re-integrated with bulk region 940. Accordingly, bulk region 940 may extend through the portion of sidewall region 950 to the other end of storage element 920. The process for forming storage element 920 is described in more detail herein and with reference to FIGS. 10 through 13.

Figure 10:
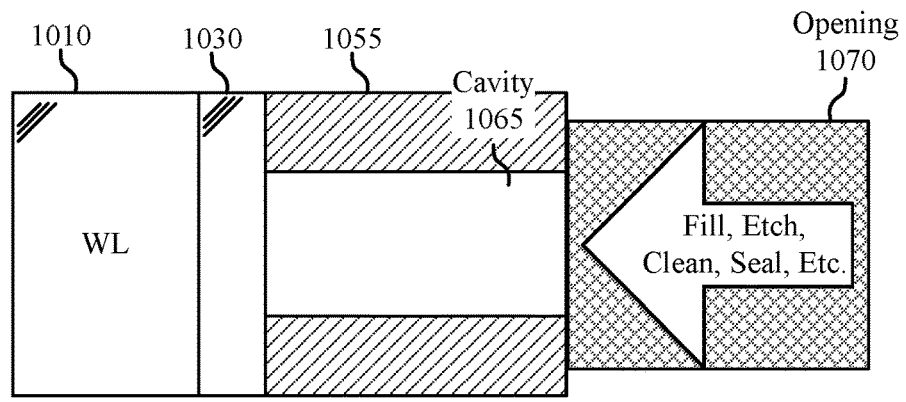
FIGS. 10 through 13 illustrate diagrams for forming a horizontal rail that includes a memory cell having a bulk region and a sidewall region as well as multiple views of the storage element in accordance with examples as disclosed herein.
Figure 10:
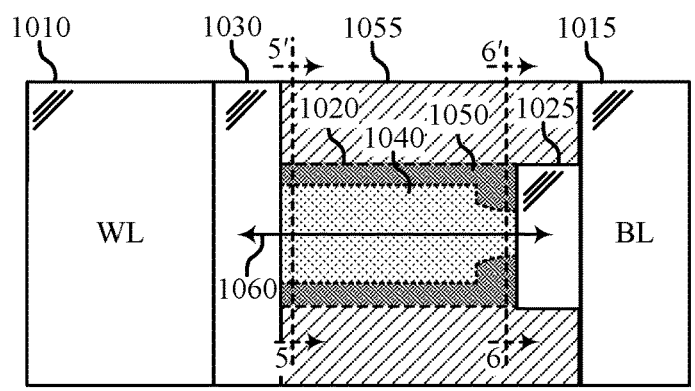
Figure 10:

FIG. 10 illustrates a diagram for forming a horizontal rail that includes a memory cell having a bulk region and a sidewall region as well as multiple views of the storage element in accordance with examples as disclosed herein.

Formation diagram 1000 may depict a set of operations for forming one or more components of a memory cell (including a storage element, such as storage element 1020). Storage element 1020 may be structured similarly to storage element 920 of FIG. 9 having a sidewall and bulk region that extends from one end of the storage element to the other end of the storage element. Formation diagram 1000 shows a word line 1010, a bottom electrode 1030, and dielectric materials, such as dielectric material 1055. Formation diagram 1000 also shows cavity 1065 and opening 1070—opening 1070 may be a vertical opening that extends normal to and contacts a face of a substrate. In some examples, an operation for forming cavity 1065 (e.g., an etching process) uses opening 1070 to access cavity 1065.

First perspective 1001-a shows a cross-sectional view of memory array 600 along the line 3-3' shown in first perspective 601-a of FIG. 6A. The cross-sectional view of first perspective 1001-a may include aspects of a horizontal rail that includes storage element 1020 and may be obtained by looking from a top of storage element 1020 after obtaining the cross-section shown in first perspective 1001-a.

Second perspective 1001-b-1 shows a cross-sectional view of storage element 1020 along the line 5-5' shown in first perspective 1001-a (and may also correspond to lines 5-5' shown in FIGS. 6A and 9). The cross-sectional view of second perspective 1001-b-1 may be obtained by looking in the direction of current path 1060 through storage element 1020, at one side (e.g., a leftmost side, or beginning) of storage element 1020, after obtaining the cross-section shown in second perspective 1001-b-1.

Second perspective 1001-b-2 shows a cross-sectional view of storage element 1020 along the line 6-6' shown in first perspective 1001-a (and may also correspond to lines 6-6' shown in FIGS. 6A and 9). The cross-sectional view of second perspective 1001-b-2 may be obtained by looking in the direction of current path 1060 through storage element 1020, at an opposing side (e.g., a rightmost side, or end) of storage element 1020, after obtaining the cross-section shown in second perspective 1001-b-2.

In some examples, the process for forming a horizontally-disposed, self-selecting memory cell includes forming cavity 1065 by removing a portion of dielectric material 1055. In some examples, dielectric material 1055 may be selected to be a material that will react with a chalcogenide material if the material comes into contact with the chalcogenide material.

After forming cavity 1065, the process may include filling at least a portion of cavity 1065 by depositing a chalcogenide material into cavity 1065 (e.g., to form storage element 1020). In some examples, prior to depositing the chalcogenide material, a conductive material (e.g., Carbon) may be deposited into cavity 1065 (e.g., if bottom electrode 1030 has not yet been formed). In either case, after depositing the chalcogenide material into cavity 1065, an exterior portion of the chalcogenide material may contact dielectric material 1055. In some examples, a first pair of opposing sides of the chalcogenide material is exposed to dielectric material 1055, while a second pair of opposing sides of the chalcogenide material is not exposed to dielectric material 1055. Accordingly, a composition of the portion of the chalcogenide material that contacts dielectric material 1055 may change, forming a first portion of sidewall region 1050 along the border of dielectric material 1055.

In some examples, after depositing the chalcogenide material, additional operations may be performed to process the chalcogenide material, resulting in a second portion of the chalcogenide material to change and forming a second portion of sidewall region 1050 at one side (e.g., the rightmost side, or end) of storage element 1020, as described herein and with reference to FIG. 8. Also, additional operations may be performed to form top electrode 1025 and bit line 1015, as described herein and with reference to FIG. 8. Additionally, an electrical current may be applied through storage element 1120 to breakdown the second portion of sidewall region 1050, causing the bulk region 1040 to extend through sidewall region 1050 and contact top electrode 1025, as described herein and with reference to FIG. 8.

Accordingly, bulk region 1040 may extend from bottom electrode 1030 to top electrode 1025, as depicted in first perspective 1001-*a*. Also, as shown in second perspective 1001-*b*-1, at a first end of storage element 1020, bulk region 1040 may extend across a first portion of a cross-section of storage element 1020, while, as shown in second perspective 1001-*b*-2, at a second end of storage element 1020, bulk region 1040 may extend across a smaller portion of a cross-section of storage element 1020.

By using the reactive dielectric material, a portion of sidewall region 1050 may extend in the direction of current path 1060 from bottom electrode 1030 to top electrode 1025. Thus, this portion of sidewall region 1050 may not be broken down during operation of storage element and may increase a structural integrity of storage element 1020 throughout its operational life. Also, based on not being broken down during operation, this portion of sidewall region 1050 may be used to predictably, and consistently control dimensions of bulk region 1040.

Figure 11:
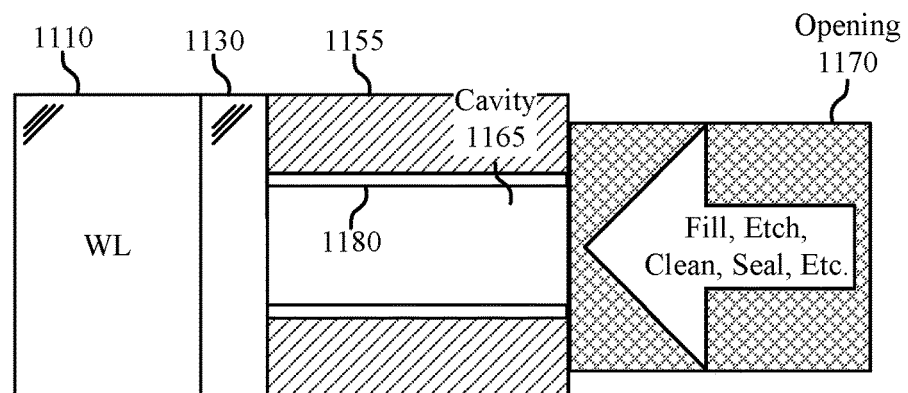
Figure 11:
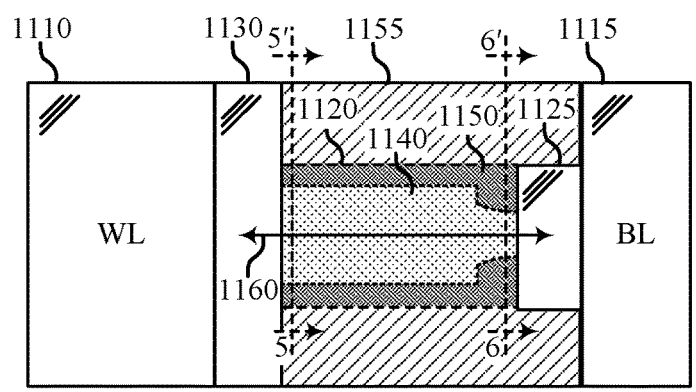
Figure 11:

FIG. 11 illustrates a diagram for forming a horizontal rail that includes a memory cell having a bulk region and a sidewall region as well as multiple views of the storage element in accordance with examples as disclosed herein.

Formation diagram 1100 may depict a set of operations for forming one or more components of a memory cell (including a storage element, such as storage element 1120). Storage element 1120 may be structured similarly to storage element 920 of FIG. 9 having a sidewall and bulk region that extends from one end of the storage element to the other end of the storage element. Formation diagram 1100 shows a word line 1110, a bottom electrode 1130, and dielectric materials, such as dielectric material 1155. Formation diagram 1100 also shows cavity 1165 and opening 1170— opening 1170 may be a vertical opening that extends normal to and contacts a face of a substrate. In some examples, an operation for forming cavity 1165 (e.g., an etching process) uses opening 1170 to access cavity 1165.

First perspective 1101-*a* shows a cross-sectional view of memory array 600 along the line 3-3' shown in first perspective 601-*a* of FIG. 6A. The cross-sectional view of first perspective 1101-*a* may include aspects of a horizontal rail that includes storage element 1120 and may be obtained by looking from a top of storage element 1120 after obtaining the cross-section shown in first perspective 1101-*a*.

Second perspective 1101-*b*-1 shows a cross-sectional view of storage element 1120 along the line 5-5' shown in first perspective 1101-*a* (and may also correspond to lines 5-5' shown in FIGS. 6A and 9). The cross-sectional view of second perspective 1101-*b*-1 may be obtained by looking in the direction of current path 1160 through storage element 1120, at one side (e.g., a leftmost side, or beginning) of storage element 1120, after obtaining the cross-section shown in second perspective 1101-*b*-1.

Second perspective 1101-*b*-2 shows a cross-sectional view of storage element 1120 along the line 6-6' shown in first perspective 1101-*a* (and may also correspond to lines 5-5' shown in FIGS. 6A and 9). The cross-sectional view of second perspective 1101-*b*-2 may be obtained by looking in the direction of current path 1160 through storage element 1120, at an opposing side (e.g., a rightmost side, or end) of storage element 1120, after obtaining the cross-section shown in second perspective 1101-*b*-2.

In some examples, the process for forming a horizontally-disposed, self-selecting memory cell includes depositing contaminant material 1180 on (or over) an interior of cavity 1165. In some examples, contaminant material 1180 is not deposited on a back wall of cavity 1165 (e.g., is not deposited on the back wall of cavity 1165 formed by bottom electrode 1130).

After depositing contaminant material 1180, the process may include filling at least a portion of cavity 1165 by depositing a chalcogenide material into cavity 1165 (e.g., to form storage element 1120). In some examples, prior to depositing the chalcogenide material, a conductive material (e.g., Carbon) may be deposited into cavity 1165 (e.g., if bottom electrode 1130 has not yet been formed). In either case, after depositing the chalcogenide material into cavity 1165, an exterior portion of the chalcogenide material may contact contaminant material 1180. In some examples, a first pair of opposing sides and a second pair of opposing sides of the chalcogenide material are exposed to contaminant material 1180. Accordingly, a composition of the portion of the chalcogenide material that contacts dielectric material 1155 may change, forming a first portion of sidewall region 1150 along the interior of cavity 1165.

In some examples, after depositing the chalcogenide material, additional operations may be performed to process the chalcogenide material, resulting in a second portion of the chalcogenide material to change and forming a second portion of sidewall region 1150 at one side (e.g., the rightmost side, or end) of storage element 1120, as described herein and with reference to FIGS. 8 and 10. Also, additional operations may be performed to form top electrode 1125 and bit line 1115, as described herein and with reference to FIGS. 8 and 10. Additionally, an electrical current may be applied through storage element 1120 to breakdown the second portion of sidewall region 1150, causing the bulk region 1140 to extend through sidewall region 1150 and contact top electrode 1125, as described herein and with reference to FIGS. 8 and 10.

Accordingly, bulk region 1140 may extend from bottom electrode 1130 to top electrode 1125, as depicted in first perspective 1101-a. Also, as shown in second perspective 1101-b-1, at a first end of storage element 1120, bulk region 1140 may extend across a first interior portion of a cross-section of storage element 1120, while, as shown in second perspective 1101-b-2, at a second end of storage element 1120, bulk region 1140 may extend across a smaller, interior portion of a cross-section of storage element 1120.

By depositing contaminant material 1180 in cavity 1165, a portion of sidewall region 1150 may extend in the direction of current path 1160 from bottom electrode 1130 to top electrode 1125. Also, the sidewall region 1150 may be present on all four sides of storage element 1120 that extend in the direction of current path 1160. The sidewall region 1150 may increase a structural integrity of storage element 1120 and be used to control the dimensions of bulk region 1140. In some examples, the sidewall region 1150 is formed so that a cross-section of bulk region 1140 taken in the direction of current path 1160 has similar width and height dimensions—e.g., based on sidewall region 1150 being present on all four sides of storage element 1120.

Figure 12:
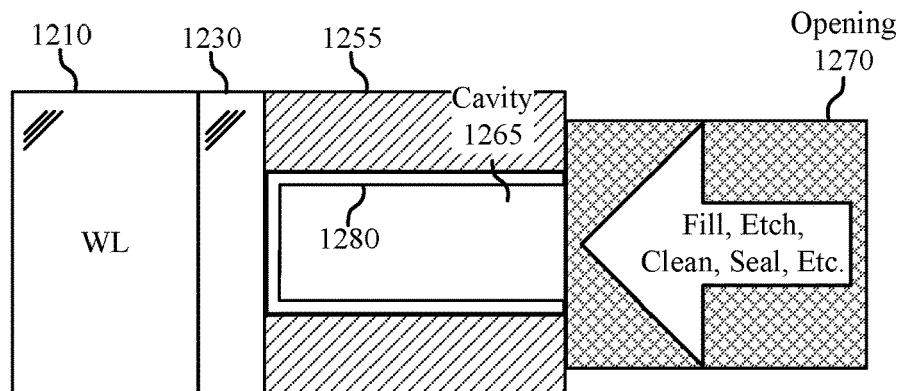
Figure 12:
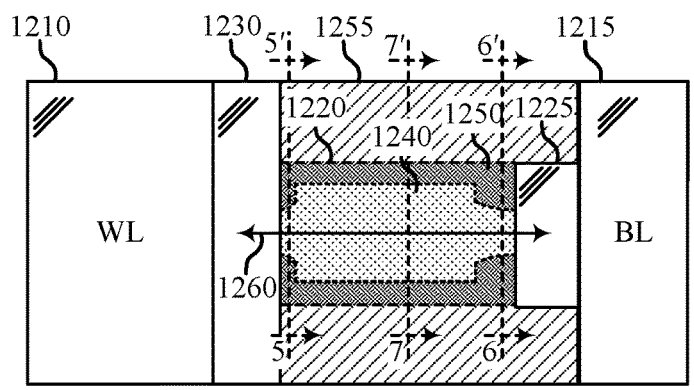
Figure 12:
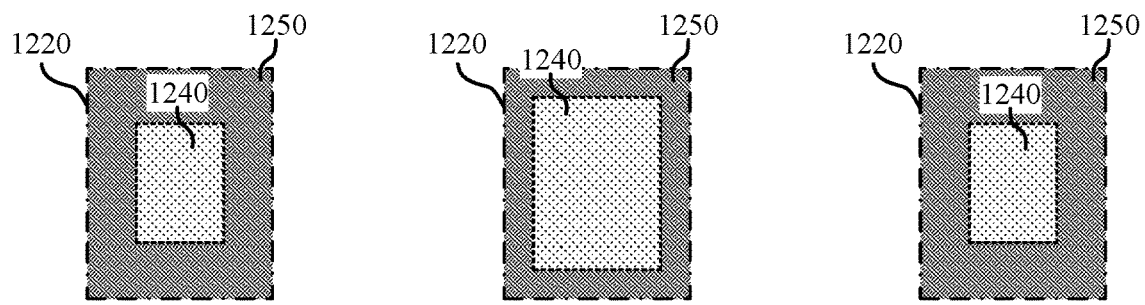

FIG. 12 illustrates a diagram for forming a horizontal rail that includes a memory cell having a bulk region and a sidewall region as well as multiple views of the storage element in accordance with examples as disclosed herein.

Formation diagram 1200 may depict a set of operations for forming one or more components of a memory cell (including a storage element, such as storage element 1220). Storage element 1220 may be structured similarly to storage element 920 of FIG. 9 having a sidewall and bulk region that extends from one end of the storage element to the other end of the storage element. Formation diagram 1200 shows a word line 1210, a bottom electrode 1230, and dielectric materials, such as dielectric material 1255. Formation diagram 1200 also shows cavity 1265 and opening 1270—opening 1270 may be a vertical opening that extends normal to and contacts a face of a substrate. In some examples, an operation for forming cavity 1265 (e.g., an etching process) uses opening 1270 to access cavity 1265.

First perspective 1201-a shows a cross-sectional view of memory array 600 along the line 3-3' shown in first perspective 601-a of FIG. 6A. The cross-sectional view of first perspective 1201-a may include aspects of a horizontal rail that includes storage element 1220 and may be obtained by looking from a top of storage element 1220 after obtaining the cross-section shown in first perspective 1201-a.

Second perspective 1201-b-1 shows a cross-sectional view of storage element 1220 along the line 5-5' shown in first perspective 1201-a (and may also correspond to lines 5-5' shown in FIGS. 6A and 9). The cross-sectional view of second perspective 1201-b-1 may obtained by looking in the direction of current path 1260 through storage element 1220, at one side (e.g., a leftmost side, or beginning) of storage element 1220, after obtaining the cross-section shown in second perspective 1201-b-1.

Second perspective 1201-b-2 shows a cross-sectional view of storage element 1220 along the line 7-7' shown in first perspective 1201-a (and may also correspond to line 7-7' shown in FIG. 9). The cross-sectional view of second perspective 1201-b-2 may be obtained by looking in the direction of current path 1260 through storage element 1220, at a middle of storage element 1220, after obtaining the cross-section shown in second perspective 1201-b-2.

Second perspective 1201-b-3 shows a cross-sectional view of storage element 1220 along the line 6-6' shown in first perspective 1201-a (and may also correspond to lines 6-6' shown in FIGS. 6A and 9). The cross-sectional view of second perspective 1201-b-3 may be obtained by looking in the direction of current path 1260 through storage element 1220, at an opposing side (e.g., a rightmost side, or end) of storage element 1220, after obtaining the cross-section shown in second perspective 1201-b-3.

In some examples, the process for forming a horizontally-disposed, self-selecting memory cell includes depositing a first chalcogenide material 1280 on (or over) an interior of cavity 1265. In some examples, first chalcogenide material 1280 is deposited on a back wall of cavity 1165 (e.g., is deposited on the back wall of cavity 1165 formed by bottom electrode 1130).

After depositing first chalcogenide material 1280, the process may include filling at least a portion of cavity 1265 by depositing a second chalcogenide material into cavity 1265 (e.g., to form storage element 1220). In some examples, prior to depositing the chalcogenide material, a conductive material (e.g., Carbon) may be deposited into cavity 1265 (e.g., if bottom electrode 1230 has not yet been formed). In either case, the second chalcogenide material may have a different composition than the composition of first chalcogenide material 1280. In such cases, the first chalcogenide material 1280 may form aspects of sidewall region 1250 and the second chalcogenide material may form bulk region 1240. In some examples, first chalcogenide material 1280 may form a first portion of sidewall region 1250 at one side (e.g., the leftmost side, or end) of storage element 1220, where the first portion of sidewall region 1250 may separate bulk region 1240 from bottom electrode 1230. First chalcogenide material 1280 may also form a second portion of sidewall region 1250 that extends from bottom electrode 1230 to top electrode 1225 along on an exterior of storage element 1220.

In some examples, after depositing the second chalcogenide material, additional operations may be performed to process the second chalcogenide material, resulting in a portion of the second chalcogenide material to change and forming a third portion of sidewall region 1250 at one side (e.g., the rightmost side, or end) of storage element 1220, as described herein and with reference to FIGS. 8, 10, and 11. Also, additional operations may be performed to form top electrode 1225 and bit line 1215, as described herein and with reference to FIGS. 8, 10, and 11. Additionally, an electrical current may be applied through storage element 1220 to breakdown the first portion of sidewall region 1250 and second portion of sidewall region 1250, causing the bulk region 1240 to extend through sidewall region 1250 in both directions to contact bottom electrode 1230 and top electrode 1225, as described herein and with reference to FIGS. 8, 10, and 11.

Accordingly, bulk region 1240 may extend from bottom electrode 1230 to top electrode 1225, as depicted in first perspective 1201-a. Also, as shown in second perspective 1201-b-1, at a first end of storage element 1220, bulk region 1240 may extend across a first interior portion of a cross-section of storage element 1220. As shown in second perspective 1201-b-2, at a middle of storage element 1220, bulk region 1240 may extend across a larger, interior portion of a cross-section of storage element 1220. And as shown in second perspective 1201-b-3, at a second end of storage element 1220, bulk region 1240 may extend across a similar interior portion of a cross-section of storage element 1220 as at the first end of storage element 1220.

By depositing first chalcogenide material 1280 in cavity 1265, a portion of sidewall region 1250 may extend in the direction of current path 1260 from bottom electrode 1230 to top electrode 1225. Also, the sidewall region 1250 may be present on all four sides of storage element 1220 that extend in the direction of current path 1260. The sidewall region 1250 may increase a structural integrity of storage element 1220 and be used to control the dimensions of bulk region 1240. In some examples, the dimensions of sidewall region 1250 are more easily controlled than using other techniques based on the dimensions of sidewall region 1250 being primarily based on an amount of first chalcogenide material 1280 that is deposited (instead of being based on a chemical reaction).

Figure 13:
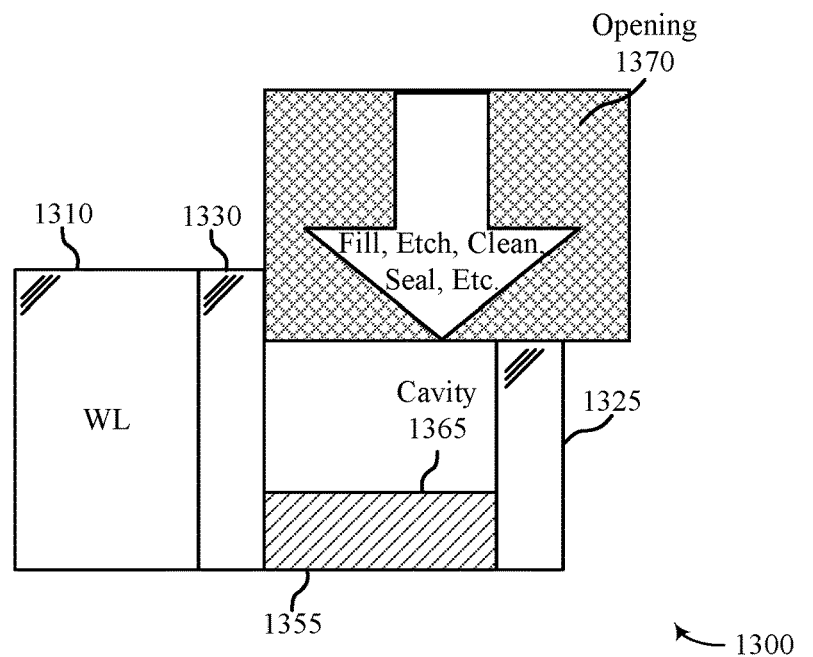
Figure 13:
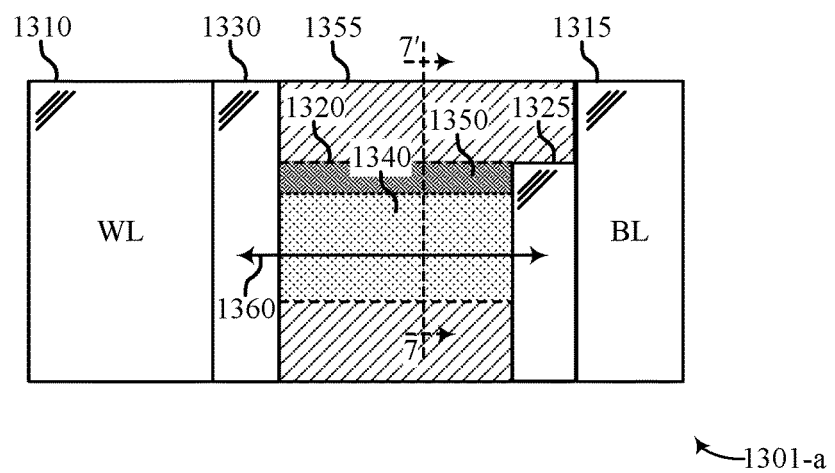
Figure 13:
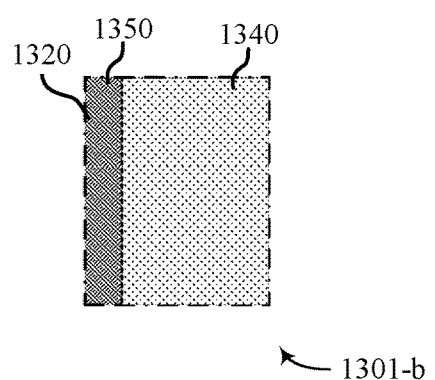

FIG. 13 illustrates a diagram for forming a horizontal rail that includes a memory cell having a bulk region and a sidewall region as well as multiple views of the storage element in accordance with examples as disclosed herein.

Formation diagram 1300 may depict a set of operations for forming one or more components of a memory cell (including a storage element, such as storage element 1320). Storage element 1320 may be structured similarly to storage element 920 of FIG. 9 having a sidewall and bulk region that extends from one end of the storage element to the other end of the storage element. Formation diagram 1300 shows a word line 1310, a bottom electrode 1330, and dielectric materials, such as dielectric material 1355. Formation diagram 1300 also shows cavity 1365 and opening 1370—opening 1370 may be a vertical opening that extends normal to and contacts a face of a substrate. In some examples, an operation for forming cavity 1365 (e.g., an etching process) uses opening 1370 to access cavity 1365. In some examples, opening 1370 may be formed after top electrode 1325 is formed and may be lateral with cavity 1365 (rather than in-line with cavity 1365 as shown in FIGS. 8 and 10 through 12).

First perspective 1301-a shows a cross-sectional view of memory array 600 along the line 3-3' shown in first perspective 601-a of FIG. 6A, The cross-sectional view of first perspective 1301-a may include aspects of a horizontal rail that includes storage element 1320 and may be obtained by looking from a top of storage element 1320 after obtaining the cross-section shown in first perspective 1301-a.

Second perspective 1301-b shows a cross-sectional view of storage element 1320 along the line 7-7' shown in first perspective 1101-a (and may also correspond to line 7-7' shown in FIG. 9). The cross-sectional view of second perspective 1301-b-1 may be obtained by looking in the direction of current path 1360 through storage element 1320 after obtaining the cross-section shown in second perspective 1301-b.

In some examples, the process for forming a horizontally-disposed, self-selecting memory cell includes filling at least a portion of cavity 1365 by depositing a chalcogenide material into cavity 1365 (e.g., to form storage element 1320). After depositing the chalcogenide material into cavity 1365, additional operations may be performed to etch away excess chalcogenide material, clean an exposed surface of the chalcogenide material of impurities (e.g. left by the cleaning process), seal an exposed surface of the chalcogenide material (e.g., to protect the chalcogenide material from other processes), temperature-treat the chalcogenide material, or any combination thereof. In some examples, the additional processes may result in a portion of the chalcogenide material that is exposed to the additional steps to change, forming sidewall region 1350 that extends parallel with current path 1360 from bottom electrode 1330 to top electrode 1325, as shown in first perspective 1301-a. Bulk region 1340 may also extend from bottom electrode 1330 to top electrode 1325, as depicted in first perspective 1301-a.

In some examples, bulk region 1340 is associated with a first composition and sidewall region 1350 is associated with a second composition. In some examples, the additional operations used to form sidewall region 1350 may performed as similarly described with reference to the operation described in FIG. 5 to increase a structural strength of sidewall region 1350, increase a resistivity of sidewall region 1350, control the dimensions of sidewall region 1350, to modify (e.g., increase or decrease) a concentration of one or more components (e.g., of one or more elements or combinations of elements) in sidewall region 1350, or any combination thereof.

As shown in second perspective 1301-b, throughout storage element 1320, bulk region 1340 may uniformly extend across a first portion of storage element 1320 and sidewall region 1350 may uniformly extend across a second portion of storage element 1320.

By depositing the chalcogenide material from a lateral side of cavity 1365, a process for forming a horizontally-disposed memory cell may avoid an operation associated with applying an electrical current through storage element 1320 to break down a portion of sidewall region 1350. Accordingly, the dimensions of bulk region 1340 and sidewall region 1350 may be uniform throughout storage element 1320.

In some examples, the process for forming the horizontally-disposed memory cell may include additional operations for forming sidewall region 1350. In some examples, the formation process may include an operation associated with forming dielectric material 1355 with a dielectric material that reacts with a chalcogenide material to form sidewall region 1350 with a lower portion on an opposing side of bulk region 1340. In some examples, the formation process may include an operation associated with depositing a contaminant material that reacts with a chalcogenide material over an interior of cavity 1365 to form sidewall region 1350 with a lower portion. In some examples, the contaminant material is not deposited on (or over) bottom electrode 1330 or top electrode 1325. In some examples, sidewall region 1350 encircles bulk region 1340 based on depositing the contaminant material into cavity 1365.

In some examples, the formation process may include an operation associated with depositing a first chalcogenide material into cavity 1365 to form sidewall region 1350 with a lower portion before depositing a second chalcogenide material into cavity 1365 to form bulk region 1340. In some examples, the first chalcogenide material may also form a leftmost and rightmost portion of sidewall region 1350 that separates bulk region 1340 from bottom electrode 1330 and top electrode 1325. In such cases, an electrical current may be applied through storage element 1320 to break down portions of sidewall region 1350 that contact bottom electrode 1330 and top electrode 1325.

Figure 14:
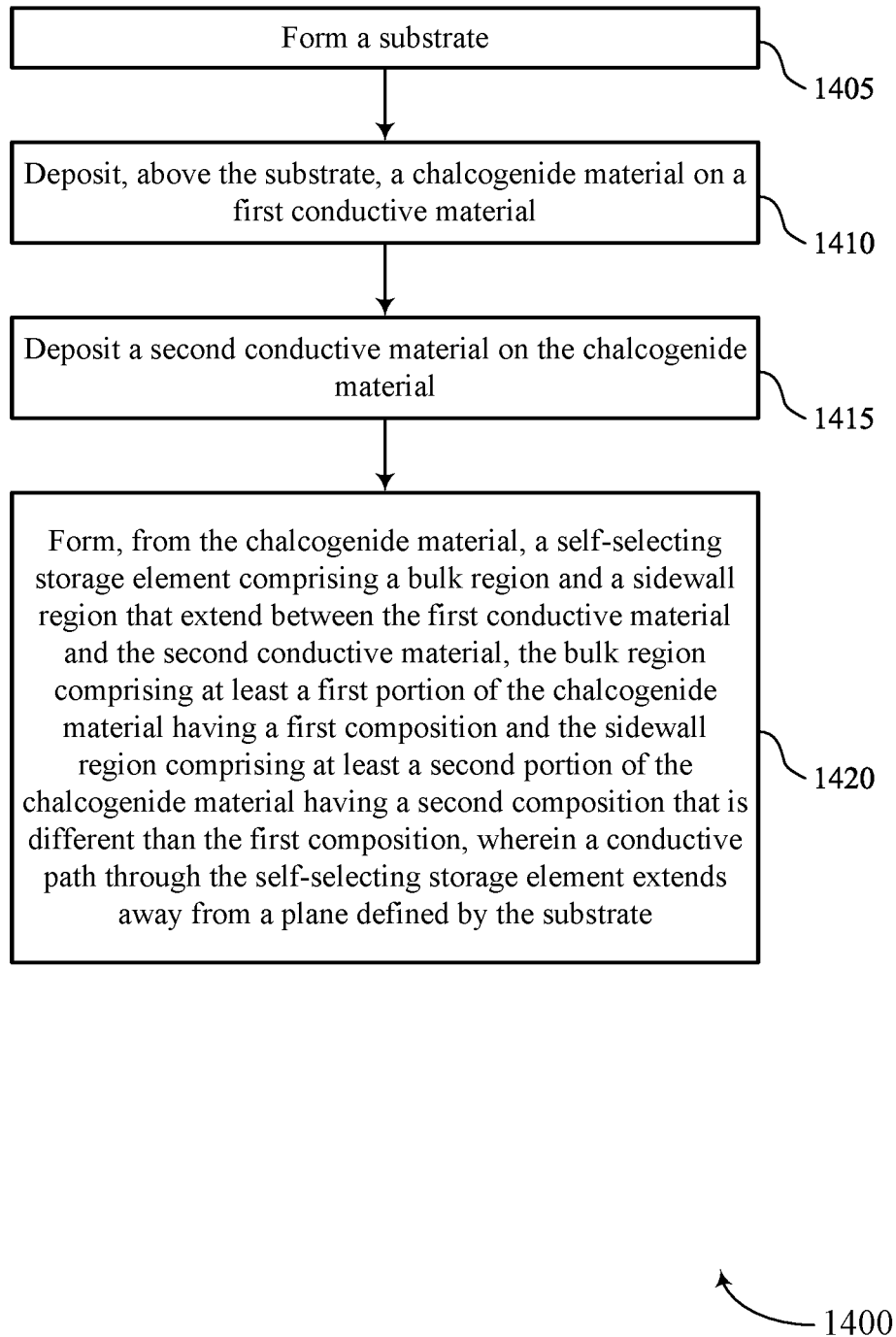
FIG. 14 shows a flowchart illustrating a method or methods that support memory cells with sidewall and bulk regions in planar structures in accordance with examples as disclosed herein.

FIG. 14 shows a flowchart illustrating a method 1400 that supports memory cells with sidewall and bulk regions in planar structures in accordance with examples as disclosed herein. The operations of method 1400 may be implemented by a manufacturing system or one or more controllers associated with a manufacturing system. In some examples, one or more controllers may execute a set of instructions to control one or more functional elements of the manufacturing system to perform the described functions. Additionally, or alternatively, one or more controllers may perform aspects of the described functions using special-purpose hardware.

At 1405, the method may include forming a substrate. The operations of 1405 may be performed in accordance with examples as disclosed herein.

At 1410, the method may include depositing, above the substrate, a chalcogenide material on a first conductive material. The operations of 1410 may be performed in accordance with examples as disclosed herein.

At 1415, the method may include depositing a second conductive material on the chalcogenide material. The operations of 1415 may be performed in accordance with examples as disclosed herein.

At 1420, the method may include forming, from the chalcogenide material, a self-selecting storage element including a bulk region and a sidewall region that extend between the first conductive material and the second conductive material, the bulk region including at least a first portion of the chalcogenide material having a first composition and the sidewall region including at least a second portion of the chalcogenide material having a second composition that is different than the first composition, where a conductive path through the self-selecting storage element extends away from a plane defined by the substrate. The operations of 1420 may be performed in accordance with examples as disclosed herein.

In some examples, an apparatus as described herein may perform a method or methods, such as the method 1400. The apparatus may include, features, circuitry, logic, means, or instructions (e.g., a non-transitory computer-readable medium storing instructions executable by a processor) for forming a substrate, depositing, above the substrate, a chalcogenide material on a first conductive material, depositing a second conductive material on the chalcogenide material, and forming, from the chalcogenide material, a self-selecting storage element including a bulk region and a sidewall region that extend between the first conductive material and the second conductive material, the bulk region including at least a first portion of the chalcogenide material having a first composition and the sidewall region including at least a second portion of the chalcogenide material having a second composition that is different than the first composition, where a conductive path through the self-selecting storage element extends away from a plane defined by the substrate.

Some examples of the method 1400 and the apparatus described herein may further include operations, features, circuitry, logic, means, or instructions for forming a first electrode that includes the first conductive material and may be in contact with a first portion of the self-selecting storage element and forming a second electrode that includes the second conductive material and may be in contact with a second portion of the self-selecting storage element.

In some examples of the method 1400 and the apparatus described herein, forming the self-selecting storage element may include operations, features, circuitry, logic, means, or instructions for etching first portions of the chalcogenide material, where a width of the sidewall region, a mechanical stability of the sidewall region, a conductivity of the sidewall region, a concentration of one or more components in the sidewall region, or any combination thereof, may be based at least in part on a process used for the etching.

In some examples of the method 1400 and the apparatus described herein, forming the self-selecting storage element may include operations, features, circuitry, logic, means, or instructions for cleaning second portions of the chalcogenide material that remain after the etching, temperature-treating the second portions of the chalcogenide material, doping the second portions of the chalcogenide material, sealing the second portions of the chalcogenide material, and any combination thereof.

In some examples of the method 1400 and the apparatus described herein, the width of the sidewall region, the mechanical stability of the sidewall region, the conductivity of the sidewall region, the concentration of the one or more components in the sidewall region, or any combination thereof, may be based at least in part on a duration of the cleaning, a chemical used for the cleaning, a duration of the temperature-treating, a temperature of the temperature-treating, an element used for the doping, a chemical used for the sealing, or any combination thereof.

In some examples of the method 1400 and the apparatus described herein, a duration of the cleaning may be selected to increase the width of the sidewall region until a width of the bulk region reaches a threshold, increase the mechanical stability of the sidewall region, decrease the conductivity of the sidewall region, modify a concentration of the one or more components in the sidewall region, or any combination thereof and a duration of the temperature-treating may be selected to increase the width of the sidewall region until the width of the bulk region reaches the threshold, increase the mechanical stability of the sidewall region, decrease the conductivity of the sidewall region, modify a concentration of the one or more components in the sidewall region, or any combination thereof.

In some examples of the method 1400 and the apparatus described herein, the self-selecting storage element includes a plurality of sides that extend between the first conductive material and the second conductive material, and at least one side of the plurality of sides may be exposed to one or more operations for forming the self-selecting storage element.

Some examples of the method 1400 and the apparatus described herein may further include operations, features, circuitry, logic, means, or instructions for depositing a third conductive material on the substrate, where the first conductive material may be deposited on the third conductive material, removing portions of the third conductive material to form a word line that that extends in a first direction parallel to the plane, depositing a fourth conductive material on the second conductive material, where the fourth conductive material may be deposited on the second conductive material, and removing portions of the fourth conductive material to form a bit line that that extends in a second direction parallel to the plane.

In some examples of the method 1400 and the apparatus described herein, a first portion of the sidewall region and a second portion of the sidewall region opposite the first portion may be formed based at least in part on forming the word line, a width, stability, resistivity, and composition of the first portion of the sidewall region and the second portion of the sidewall region being equivalent and a third portion of the sidewall region and a fourth portion of the sidewall region opposite the third portion may be formed based at least in part on forming the bit line, a width, stability, resistivity, and composition of the third portion of the sidewall region and the fourth portion of the sidewall region being equivalent.

It should be noted that the methods described herein describe possible implementations, and that the operations and the steps may be rearranged or otherwise modified and that other implementations are possible. Furthermore, portions from two or more of the methods may be combined.

An apparatus is described. The apparatus may include a substrate, a first electrode, a second electrode, where a conductive path between the first electrode and the second electrode extends away from a plane defined by the substrate, and a self-selecting storage element positioned between the first electrode and the second electrode, where the self-selecting storage element includes a bulk region and a sidewall region that extend between the first electrode and the second electrode, the bulk region including a chalcogenide material having a first composition and the sidewall region including the chalcogenide material having a second composition that is different than the first composition.

In some examples, the apparatus may include a word line that extends in a first direction parallel to the plane, where the first electrode may be in contact with the word line and a bit line that extends in a second direction parallel to the plane, where the second electrode may be in contact with the bit line.

In some examples of the apparatus, a performance of the bulk region to store information may be based at least in part on a width of the sidewall region, the width of the sidewall region being configured to increase the performance of the bulk region.

In some examples of the apparatus, the width of the sidewall region may be between 5% and 50% of a width of the self-selecting storage element.

In some examples of the apparatus, a first concentration of one or more components in the first composition of the chalcogenide material exceed one or more thresholds and a second concentration of the one or more components in the second composition of the chalcogenide material may be less than or equal to the one or more thresholds.

In some examples of the apparatus, a first concentration of one or more components in the first composition of the chalcogenide material is between two and twenty percent different than a second concentration of the one or more components in the second composition.

In some examples of the apparatus, the first composition of the chalcogenide material may be programmable between multiple states based at least in part on a voltage being applied across the self-selecting storage element, and the second composition of the chalcogenide material remains in one state regardless of the voltage being applied across the self-selecting storage element.

In some examples of the apparatus, the second composition of the chalcogenide material may have a first mechanical stability that may be higher than a second mechanical stability of the first composition of the chalcogenide material.

In some examples of the apparatus, the self-selecting storage element includes a plurality of sides that extend between the first electrode and the second electrode, and the sidewall region includes at least one of the plurality of sides.

In some examples of the apparatus, the self-selecting storage element may be positioned on top of the first electrode, and the second electrode may be positioned on top of the self-selecting storage element.

In some examples, the apparatus may include a memory cell including the first electrode, the self-selecting storage element, and the second electrode, the memory cell extending away from the plane.

Another apparatus is described. The apparatus may include a memory array including a plurality of memory cells, each memory cell of the plurality of memory cells including, a first electrode, a second electrode, a self-selecting storage element positioned between the first electrode and the second electrode, where the self-selecting storage element includes a bulk region and a sidewall region that extend between the first electrode and the second electrode in a first direction, the bulk region including a chalcogenide material having a first composition and the sidewall region including the chalcogenide material having a second composition that is different than the first composition, and a controller coupled with the memory array and configured to program a state of the plurality of memory cells by applying voltages across the plurality of memory cells.

In some examples of the apparatus, the memory array further includes a word line coupled with the plurality of memory cells and extending in a second direction that may be at a first angle relative to the first direction and a bit line coupled with at least one memory cell of the plurality of memory cells and extending in a third direction that may be at a second angle relative to the first direction.

In some examples of the apparatus, a performance of the bulk region may be based at least in part on a width of the sidewall region in a direction that may be orthogonal to the first direction.

In some examples of the apparatus, the width of the sidewall region may be between 5% and 50% of a width of the self-selecting storage element in the direction that may be orthogonal to the first direction.

In some examples of the apparatus, the first composition of the chalcogenide material may be programmable between multiple states based at least in part on a voltage being applied across the self-selecting storage element, and the second composition of the chalcogenide material remains in one state regardless of the voltage being applied across the self-selecting storage element.

In some examples of the apparatus, the second composition of the chalcogenide material may have a first mechanical stability that may be higher than a second mechanical stability of the first composition of the chalcogenide material.

In some examples of the apparatus, the self-selecting storage element includes a plurality of sides that extend between the first electrode and the second electrode in the first direction, and the sidewall region includes at least one of the plurality of sides.

In some examples of the apparatus, the memory array includes a substrate, and the plurality of memory cells may be positioned away from the substrate in the first direction.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a substrate;
   a first electrode;
   a second electrode, wherein a conductive path between the first electrode and the second electrode extends away from a plane defined by the substrate; and
   a self-selecting storage element positioned between the first electrode and the second electrode, wherein the self-selecting storage element comprises a bulk region and a sidewall region that extend between the first electrode and the second electrode, the bulk region comprising a chalcogenide material having a first composition and the sidewall region comprising the chalcogenide material having a second composition that is different than the first composition, wherein the second composition of the chalcogenide material has a first mechanical stability that is higher than a second mechanical stability of the first composition of the chalcogenide material.

2. The apparatus of claim 1, further comprising:
   a word line that extends in a first direction parallel to the plane, wherein the first electrode is in contact with the word line; and
   a bit line that extends in a second direction parallel to the plane, wherein the second electrode is in contact with the bit line.

3. The apparatus of claim 1, wherein a performance of the bulk region to store information is based at least in part on a width of the sidewall region, the width of the sidewall region being configured to increase the performance of the bulk region.

4. The apparatus of claim 3, wherein the width of the sidewall region is between 5% and 50% of a width of the self-selecting storage element.

5. The apparatus of claim 1, wherein a first concentration of one or more components in the first composition of the chalcogenide material exceed one or more thresholds and a second concentration of the one or more components in the second composition of the chalcogenide material are less than or equal to the one or more thresholds.

6. The apparatus of claim 1, wherein the self-selecting storage element comprises a plurality of sides that extend between the first electrode and the second electrode, and wherein the sidewall region comprises at least one of the plurality of sides.

7. The apparatus of claim 1, wherein the self-selecting storage element is positioned on top of the first electrode, and wherein the second electrode is positioned on top of the self-selecting storage element.

8. The apparatus of claim 1, further comprising:
   a memory cell comprising the first electrode, the self-selecting storage element, and the second electrode, the memory cell extending away from the plane.

9. An apparatus, comprising:
   a substrate;
   a first electrode;
   a second electrode, wherein a conductive path between the first electrode and the second electrode extends away from a plane defined by the substrate; and
   a self-selecting storage element positioned between the first electrode and the second electrode, wherein the self-selecting storage element comprises a bulk region and a sidewall region that extend between the first electrode and the second electrode, the bulk region comprising a chalcogenide material having a first composition and the sidewall region comprising the chalcogenide material having a second composition that is different than the first composition, wherein a first concentration of one or more components in the first composition of the chalcogenide material is between two and twenty percent different than a second concentration of the one or more components in the second composition.

10. An apparatus, comprising:
    a substrate;
    a first electrode;
    a second electrode, wherein a conductive path between the first electrode and the second electrode extends away from a plane defined by the substrate; and
    a self-selecting storage element positioned between the first electrode and the second electrode, wherein the self-selecting storage element comprises a bulk region and a sidewall region that extend between the first electrode and the second electrode, the bulk region comprising a chalcogenide material having a first composition and the sidewall region comprising the chalcogenide material having a second composition that is different than the first composition, wherein the first composition of the chalcogenide material is programmable between multiple states based at least in part on a voltage being applied across the self-selecting storage element, and wherein the second composition of the chalcogenide material remains in one state regardless of the voltage being applied across the self-selecting storage element.

11. An apparatus, comprising:
a memory array comprising a plurality of memory cells, each memory cell of the plurality of memory cells comprising:
  a first electrode,
  a second electrode, and
  a self-selecting storage element positioned between the first electrode and the second electrode, wherein the self-selecting storage element comprises a bulk region and a sidewall region that extend between the first electrode and the second electrode in a first direction, the bulk region comprising a chalcogenide material having a first composition and the sidewall region comprising the chalcogenide material having a second composition that is different than the first composition, wherein the second composition of the chalcogenide material has a first mechanical stability that is higher than a second mechanical stability of the first composition of the chalcogenide material; and
a controller coupled with the memory array and configured to program a state of the plurality of memory cells by applying voltages across the plurality of memory cells.

12. The apparatus of claim 11, wherein the memory array further comprises:
a word line coupled with the plurality of memory cells and extending in a second direction that is at a first angle relative to the first direction; and
a bit line coupled with at least one memory cell of the plurality of memory cells and extending in a third direction that is at a second angle relative to the first direction.

13. The apparatus of claim 11, wherein a performance of the bulk region is based at least in part on a width of the sidewall region in a direction that is orthogonal to the first direction.

14. The apparatus of claim 13, wherein the width of the sidewall region is between 5% and 50% of a width of the self-selecting storage element in the direction that is orthogonal to the first direction.

15. The apparatus of claim 11, wherein the self-selecting storage element comprises a plurality of sides that extend between the first electrode and the second electrode in the first direction, and wherein the sidewall region comprises at least one of the plurality of sides.

16. The apparatus of claim 11, wherein the memory array comprises a substrate, and wherein the plurality of memory cells is positioned away from the substrate in the first direction.

17. An apparatus, comprising:
a memory array comprising a plurality of memory cells, each memory cell of the plurality of memory cells comprising:
  a first electrode,
  a second electrode, and
  a self-selecting storage element positioned between the first electrode and the second electrode, wherein the self-selecting storage element comprises a bulk region and a sidewall region that extend between the first electrode and the second electrode in a first direction, the bulk region comprising a chalcogenide material having a first composition and the sidewall region comprising the chalcogenide material having a second composition that is different than the first composition; and
a controller coupled with the memory array and configured to program a state of the plurality of memory cells by applying voltages across the plurality of memory cells, wherein the first composition of the chalcogenide material is programmable between multiple states based at least in part on a voltage being applied across the self-selecting storage element, and wherein the second composition of the chalcogenide material remains in one state regardless of the voltage being applied across the self-selecting storage element.

* * * * *